US012713624B2

(12) United States Patent
Wang et al.

(10) Patent No.: US 12,713,624 B2
(45) Date of Patent: Aug. 18, 2026

(54) BACKSIDE POWER

(71) Applicants: Advanced Micro Devices, Inc., Santa Clara, CA (US); Xilinx, Inc., San Jose, CA (US)

(72) Inventors: Yan Wang, San Jose, CA (US); Kevin Gillespie, Boxborough, MA (US); Samuel Naffziger, Fort Collins, CO (US); Richard Schultz, Fort Collins, CO (US); Raja Swaminathan, Austin, TX (US); Omar Zia, Austin, TX (US); John Wuu, Fort Collins, CO (US)

(73) Assignees: Advanced Micro Devices, Inc., Santa Clara, CA (US); Xilinx, Inc., San Jose, CA (US)

( * ) Notice: Subject to any disclaimer, the term of this patent is extended or adjusted under 35 U.S.C. 154(b) by 348 days.

(21) Appl. No.: 18/474,166

(22) Filed: Sep. 25, 2023

(65) Prior Publication Data

US 2024/0321702 A1 Sep. 26, 2024

Related U.S. Application Data

(60) Provisional application No. 63/505,362, filed on May 31, 2023, provisional application No. 63/505,359, (Continued)

(51) Int. Cl.
*H10W 90/26* (2026.01)
*H10B 80/00* (2023.01)
*H10W 90/00* (2026.01)

(52) U.S. Cl.
CPC ............ *H10B 80/00* (2023.02); *H10W 90/00* (2026.01); *H10W 90/792* (2026.01)

(58) Field of Classification Search
CPC ................ H10B 80/00; H01L 25/0657; H01L 2224/08145; H01L 2224/06181; H01L 23/3677; H01L 2225/06513; H01L 2225/06517; H01L 2225/06527; H01L 2225/06565; H01L 2225/06589; H01L 23/34; H01L 23/3675; H01L 24/08; H01L 23/36; H01L 23/481; H01L 23/49816; H01L 23/49822; H01L 23/49827; H01L 23/5286; H01L 23/544; H01L 24/32; H01L 25/0652; H01L 25/18; H01L 25/50
(Continued)

(56) References Cited

U.S. PATENT DOCUMENTS 10,529,637 B1 1/2020 Yu et al.
2015/0021789 A1 1/2015 Lin
(Continued)

OTHER PUBLICATIONS

International Search Report and Written Opinion from International Application No. PCT/US2024/020779, mailed Jul. 8, 2024 (10 pages).

*Primary Examiner* — Theresa T Doan
(74) *Attorney, Agent, or Firm* — Greenberg Traurig, LLP

(57) ABSTRACT

A method for providing backside power can include providing a first circuit die having a first metal stack. The method can also include connecting a second metal stack of a second circuit die to the first metal stack of the first circuit die, wherein a backside power delivery network is located in a passivation layer of at least one of the first circuit die or the second circuit die. Various other methods, systems, and computer-readable media are also disclosed.

20 Claims, 25 Drawing Sheets

Related U.S. Application Data filed on May 31, 2023, provisional application No. 63/505,355, filed on May 31, 2023, provisional application No. 63/505,365, filed on May 31, 2023, provisional application No. 63/505,341, filed on May 31, 2023, provisional application No. 63/505,356, filed on May 31, 2023, provisional application No. 63/491,461, filed on Mar. 21, 2023, provisional application No. 63/491,471, filed on Mar. 21, 2023, provisional application No. 63/491,456, filed on Mar. 21, 2023, provisional application No. 63/491,479, filed on Mar. 21, 2023, provisional application No. 63/491,488, filed on Mar. 21, 2023, provisional application No. 63/491,466, filed on Mar. 21, 2023.

(58) Field of Classification Search

USPC .......................................................... 257/774

See application file for complete search history.

(56) References Cited

U.S. PATENT DOCUMENTS

| | | | | |
|---|---|---|---|---|
| 2019/0131255 | A1 | 5/2019 | Teng et al. | |
| 2019/0363079 | A1 | 11/2019 | Thei et al. | |
| 2020/0076424 | A1* | 3/2020 | Dubey | H10D 88/00 |
| 2021/0074709 | A1 | 3/2021 | Liu | |
| 2021/0265308 | A1 | 8/2021 | Norman et al. | |
| 2023/0022167 | A1 | 1/2023 | Prashant et al. | |

* cited by examiner

BACKSIDE POWER

CROSS REFERENCE TO RELATED APPLICATION

This application claims the benefit of U.S. Provisional Application No. 63/491,456, filed 21 Mar. 2023. This application additionally claims the benefit of U.S. Provisional Application No. 63/491,461, filed 21 Mar. 2023. This application also claims the benefit of U.S. Provisional Application No. 63/491,466, filed 21 Mar. 2023. This application further claims the benefit of U.S. Provisional Application No. 63/491,471, filed 21 Mar. 2023. This application further claims the benefit of U.S. Provisional Application No. 63/491,479, filed 21 Mar. 2023. This application further claims the benefit of U.S. Provisional Application No. 63/491,488, filed 21 Mar. 2023. This application further claims the benefit of U.S. Provisional Application No. 63/505,341, filed 31 May 2023. This application further claims the benefit of U.S. Provisional Application No. 63/505,355, filed 31 May 2023. This application further claims the benefit of U.S. Provisional Application No. 63/505,356, filed 31 May 2023. This application further claims the benefit of U.S. Provisional Application No. 63/505,359, filed 31 May 2023. This application further claims the benefit of U.S. Provisional Application No. 63/505,362, filed 31 May 2023. This application further claims the benefit of U.S. Provisional Application No. 63/505,365, filed 31 May 2023. The disclosures of the above-referenced applications are incorporated, in their entirety, by reference herein.

BACKGROUND

With 3D die stacking, power for one or more of the stacked die can be delivered using Through-Silicon-Via (TSV) etched through a bottom die forming power curtains for power delivery integrity. The TSV array occupies a larger portion of the bottom die area including a keep out zone (KOZ) to the active circuit to prevent device degradation. TSV typically lands on a thick metal layer and can also have a power grid with a metal/via tower to deliver power to the circuit, hence adding additional connection and potential performance impact with additional IR drop.

BRIEF DESCRIPTION OF THE DRAWINGS AND APPENDICES

The accompanying drawings illustrate a number of exemplary implementations and are a part of the specification. Together with the following description, these drawings demonstrate and explain various principles of the present disclosure.

Figure 1:
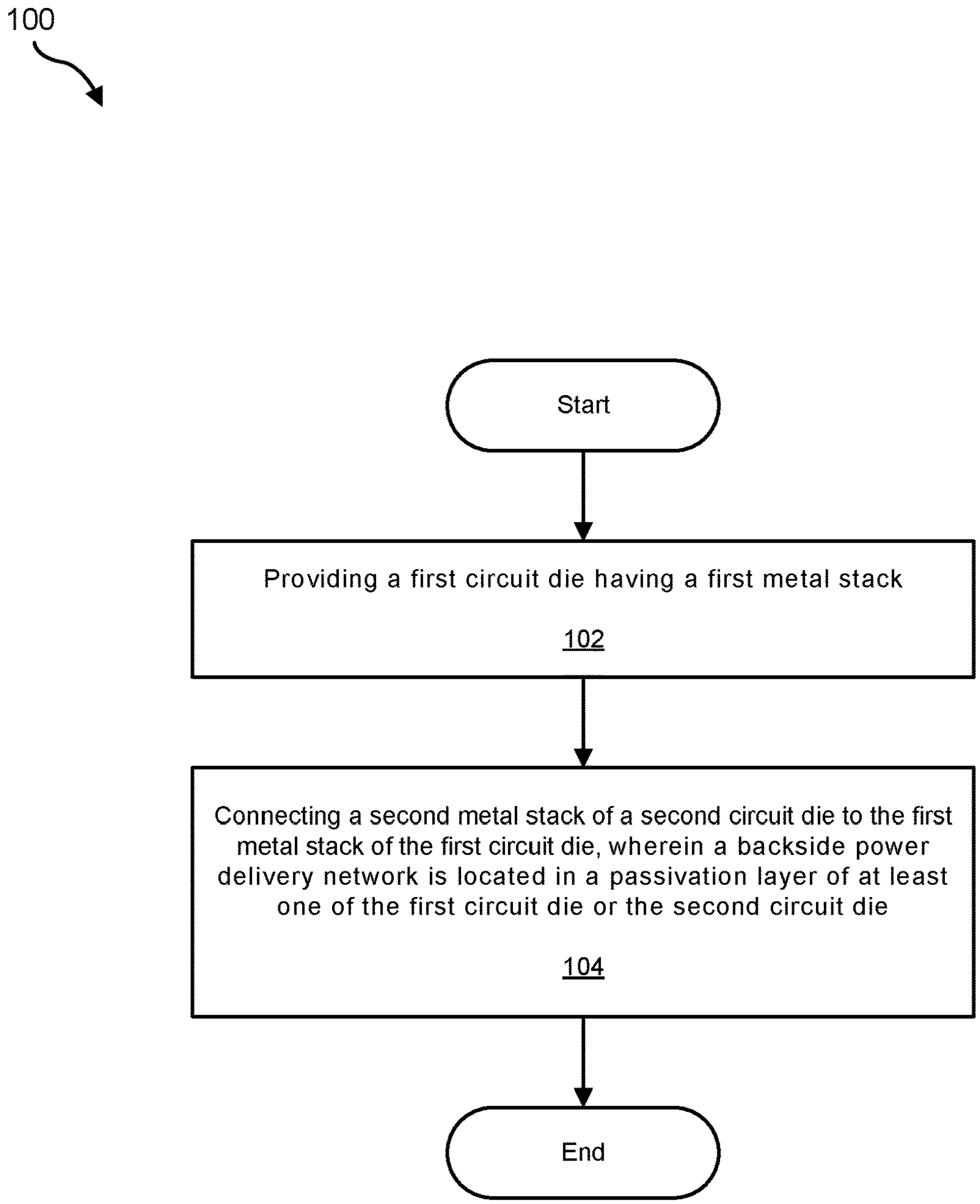
FIG. 1 is a flow diagram illustrating an example method for providing backside power.

Throughout the drawings, identical reference characters and descriptions indicate similar, but not necessarily identical, elements. While the exemplary implementations described herein are susceptible to various modifications and alternative forms, specific implementations have been shown by way of example in the drawings and will be described in detail herein. However, the exemplary implementations described herein are not intended to be limited to the particular forms disclosed. Rather, the present disclosure covers all modifications, equivalents, and alternatives falling within the scope of the appended claims.

DETAILED DESCRIPTION

The present disclosure is generally directed to integrated circuits and/or semiconductor devices that implement backside power. For example, in a 3D die stacking arrangement, a node with backside power technology can be utilized as a bottom die. Utilizing this node as the bottom die delivers power directly through the backside of the bottom die wafer to both bottom and top die circuits.

Benefits obtained from the above arrangement can result from avoiding TSV array usage for power delivery of the stacked product. Hence, increased area and potential IR drop penalty resulting from use of arrays of through silicon vias (TSVs) (e.g., power curtains) through the circuit (e.g., transistor layer) of the bottom die can be avoided. Avoiding such arrays of TSVs that require keep out zones (KOZs) (e.g., power curtains) can save product cost and/or improve performance of the integrated circuit and/or semiconductor device.

Features from any of the implementations described herein can be used in combination with one another in accordance with the general principles described herein. These and other implementations, features, and advantages will be more fully understood upon reading the following detailed description in conjunction with the accompanying drawings and claims.

In one example, an integrated circuit includes a first circuit die having a first metal stack, a second circuit die having a second metal stack that is connected to the first metal stack of the first circuit die, and a backside power delivery network in a passivation layer of at least one of the first circuit die or the second circuit die.

Another example can be the previously described example integrated circuit, wherein the backside power delivery network provides power directly to a transistor layer of the at least one of the first circuit die or the second circuit die by at least one of backside vias or nano through silicon vias.

Another example can be any of the previously described example integrated circuits, wherein the backside power delivery network is located in the passivation layer of the first circuit die.

Another example can be any of the previously described example integrated circuits, further including an additional backside power delivery network in an additional passivation layer of the second circuit die.

Another example can be any of the previously described example integrated circuits, wherein the additional backside power delivery network provides power directly to a transistor layer of the second circuit die.

Another example can be any of the previously described example integrated circuits, wherein the additional backside power delivery network provides power directly to the transistor layer of the second circuit die by at least one of backside vias or nano through silicon vias.

Another example can be any of the previously described example integrated circuits, wherein a transistor layer of the second circuit die is configured to receive power directly from an additional die by direct bonding of a silicon body of the second circuit die to the additional die.

In one example, a semiconductor device includes an integrated circuit that includes a first circuit die having a first metal stack, wherein the first circuit die corresponds to a primary thermal source of the integrated circuit and a second circuit die having a second metal stack that is connected to the first metal stack of the first circuit die, an additional die connected to the second circuit die, and a backside power delivery network in a passivation layer of at least one of the first circuit die, the second circuit die, or the active interposer die.

Another example can be the previously described example semiconductor device, wherein the backside power delivery network is located in the passivation layer of the first circuit die.

Another example can be any of the previously described example semiconductor devices, further including an additional backside power delivery network in an additional passivation layer of the second circuit die.

Another example can be any of the previously described example semiconductor devices, further including an additional backside power delivery network in an additional passivation layer of the additional die.

Another example can be any of the previously described example semiconductor devices, wherein a transistor layer of the second circuit die is configured to receive power directly from the additional die by direct bonding of a silicon body of the second circuit die to the additional die.

Another example can be any of the previously described example semiconductor devices, wherein a transistor layer of the additional die is configured to receive power directly from a package of the semiconductor device by direct bonding of a silicon body of the additional die to the package of the semiconductor device.

In one example, a method includes providing a first circuit die having a first metal stack and connecting a second metal stack of a second circuit die to the first metal stack of the first circuit die, wherein a backside power delivery network is located in a passivation layer of at least one of the first circuit die or the second circuit die.

Another example can be the previously described example method, wherein the backside power delivery network is located in the passivation layer of the first circuit die.

Another example can be any of the previously described example methods, further including an additional backside power delivery network in an additional passivation layer of the second circuit die.

Another example can be any of the previously described example methods, further including connecting an additional die to the second circuit die.

Another example can be any of the previously described example methods, wherein an additional backside power delivery network is located in an additional passivation layer of the additional die.

Another example can be any of the previously described example methods, wherein a transistor layer of the second circuit die is configured to receive power directly from the additional die by direct bonding of a silicon body of the second circuit die to the additional die.

Another example can be any of the previously described example methods, wherein a transistor layer of the additional die is configured to receive power directly from a package of a semiconductor device by direct bonding of a silicon body of the additional die to the package of the semiconductor device.

The following will provide, with reference to FIG. 1, detailed descriptions of example methods for providing backside power. Detailed descriptions of corresponding integrated circuits will also be provided in connection with FIGS. 2-4, 7, and 8. In addition, detailed descriptions of example wafer on wafer and chip on wafer processes will be provided in connection with FIGS. 5 and 6. Further, detailed descriptions of example semiconductor devices will be provided in connection with FIGS. 9-25.

FIG. 1 illustrates an example method 100 for providing backside power. The steps shown in FIG. 1 can be performed by any suitable computer-executable code and/or computing system. In one example, each of the steps shown in FIG. 1 can represent an algorithm whose structure includes and/or is represented by multiple sub-steps, examples of which will be provided in greater detail below.

As illustrated in FIG. 1, step 102 can include providing a circuit die. For example, step 102 can include providing a first circuit die having a first metal stack.

The term "circuit die," as used herein, can generally refer to a small block of semiconducting material on which a given functional circuit is fabricated. For example, and without limitation, integrated circuits can be produced in large batches on a single wafer of electronic-grade silicon (EGS) or other semiconductor (e.g., GaAs) through processes such as photolithography. A wafer is cut (e.g., diced) into many pieces, each containing one copy of the circuit. Each of these pieces can be called a die. There are three commonly used plural forms: dice, dies, and die. To simplify handling and integration onto a printed circuit board, most die are packaged in various forms.

The term "metal stack," as used herein, can generally refer to one or more layers of metal provided in or one a circuit die. For example, and without limitation, a metal stack can be configured as a back end of line (BEOL), a redistribution layer, wires, or any other configuration that communicatively couples transistors and/or other devices in a circuit die to one another and/or to transistors and/or other devices in another circuit die.

Step 102 can be performed in various ways. For example, the backside power delivery network can be located in the passivation layer of the first circuit die. In some of these examples, the backside power delivery network can provide power directly to a transistor layer of the first circuit die by at least one of backside vias or nano through silicon vias. Additional details of sub steps that can be performed in step 102 are described later with reference to FIGS. 11-25.

The term "backside vias," as used herein, can generally refer to vias that directly contact a device from a backside of the die. For example, and without limitation, backside vias can directly contact circuit elements of a transistor layer of a die without connecting to metal layers in and/or on a front side of the die.

The term "nano through silicon vias," as used herein, can generally refer to vias formed through a silicon body (e.g., having dimensions less than one micrometer) of a die and connecting to lower level metal layers on a front side of the die. For example, and without limitation, nano through silicon vias can connect to the front side metal layers of the die without requiring keep out zones from devices (e.g., circuit elements) of the die.

Step 104 can include connecting at least one other circuit die to the circuit die. For example, step 104 can include connecting a second metal stack of a second circuit die to the first metal stack of the first circuit die, wherein a backside power delivery network is located in a passivation layer of at least one of the first circuit die or the second circuit die.

The term "backside power delivery network," as used herein, can generally refer to power routing elements located on a backside of a circuit die. For example, a backside power delivery network can deliver power to circuit elements of the die from the backside without using power curtains that require keep out zones from the circuit elements to delivery power to a front side landing metal. Rather, a backside power delivery network can deliver power through backside vias and/or nano through silicon vias to the circuit elements of the die and to front side metal layers of the die without requiring power curtains or keep out zones.

The term "passivation layer," as used herein, can generally refer to one or more layers formed to protect internal semiconductor devices after the completion of metallization. For example, and without limitation, passivation layers can be formed with deposition of an oxide layer and a nitride layer.

Step 104 can be performed in various ways. For example, the backside power delivery network can be located in the passivation layer of the second circuit die. In some of these examples, the backside power delivery network can provide power directly to a transistor layer of the second circuit die by at least one of backside vias or nano through silicon vias. In other examples, the backside power delivery network can be located in the passivation layer of the first circuit die, and an additional backside power delivery network can be located in an additional passivation layer of the second circuit die. In some of these examples, the backside power delivery networks can provide power directly to transistor layers of the first circuit die and the second circuit die by at least one of backside vias or nano through silicon vias. Alternatively or additionally, step 104 can include connecting an additional die (e.g., an active interposer die) to the second circuit die. In some of these examples, one or more backside power delivery networks can be located in a passivation layer of the first circuit die and/or the second circuit die, and an additional backside power delivery network can be located in an additional passivation layer of the additional die. In other examples, a transistor layer of the second circuit die can be configured to receive power directly from the additional die by direct bonding of a silicon body (e.g., an extremely thin silicon body) of the second circuit die to the additional die. Additionally or alternatively, a transistor layer of the additional die can configured to receive power directly from a package of a semiconductor device by direct bonding of a silicon body (e.g., an extremely thin silicon body) of the additional die to the package of the semiconductor device. Additional details of sub steps that can be performed in step 104 are described later with reference to FIGS. 11-25.

The term "additional die," can generally refer to any die of semiconducting material having redistribution layers and/or circuitry of an integrated circuit. For example, and without limitation, an additional die can be an active interposer die, a circuit die of an additional integrated circuit, another die of another process-pair node, etc.

The term "active interposer die," as used herein, can generally refer to a bottom circuit die in a stacked circuit die configuration. For example, and without limitation, an active interposer die can be used to integrate flexible and distributed interconnect fabrics for scalable chiplet traffic, energy-efficient 3D-plugs using fine pitch interconnects, power management features for power supply closer to the cores, and memory-IO controller and PHY for off-chip communication.

Figure 2:
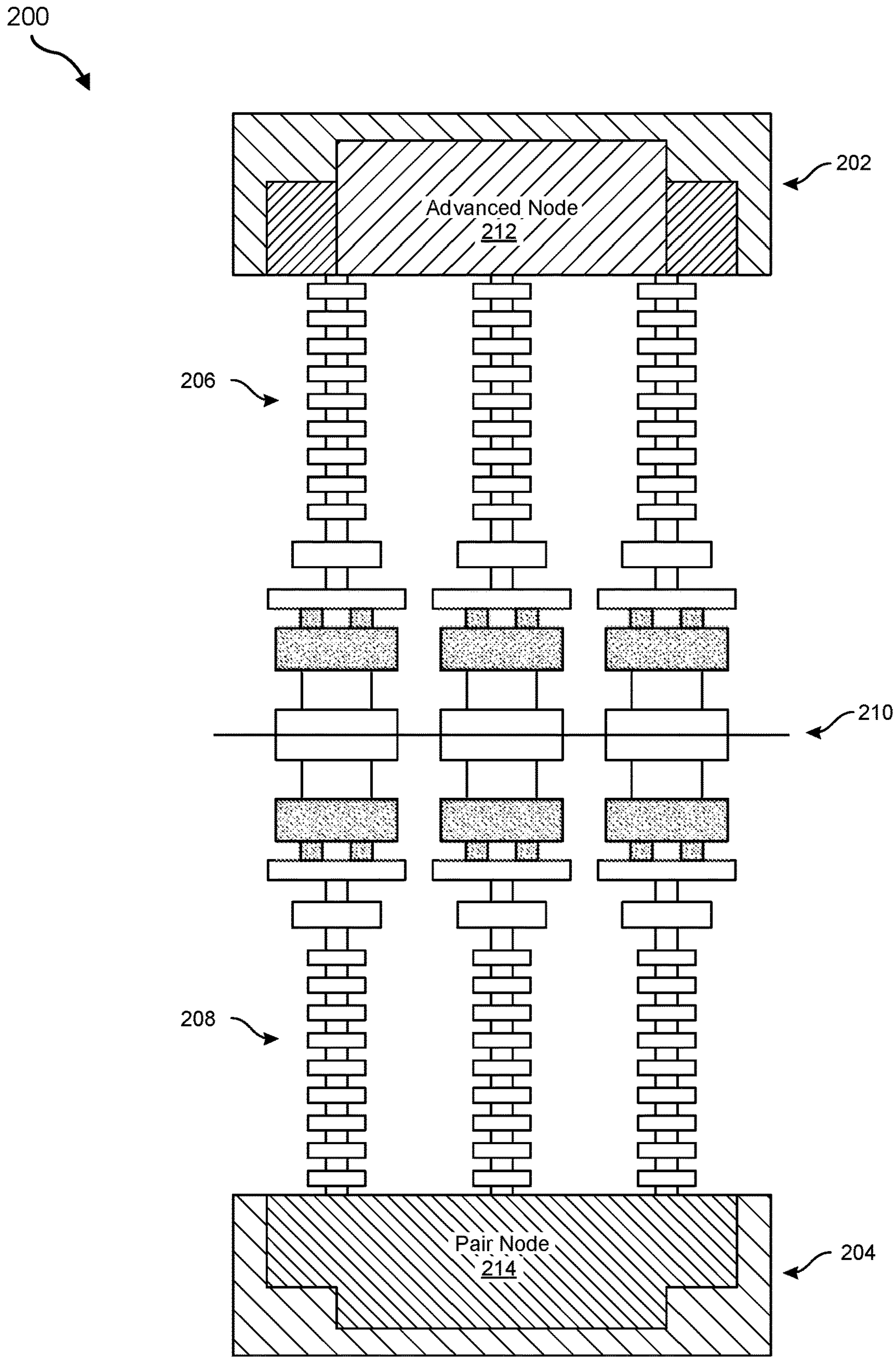
FIG. 2 is a block diagram illustrating an example integrated circuit including an advanced node and a pair node with face to face hybrid bonded metal stacks.

FIG. 2 illustrates an example integrated circuit 200 that can result from performance of method 100 of FIG. 1. Future semiconductor products will require chiplet integration of multiple die to form the final product. Two die can be connected by their respective metal stacks (e.g., flipping one die on top of the other like a sandwich). This connection can be performed using face to face stacking by hybrid bonding 210 or face to back stacking by hybrid bonding. This 3D hybrid bonding 210 can enable fine grained connectivity between the two nodes, with each node specializing in delivering optimized logic (e.g., advanced node 212), or SRAM and analog devices (e.g., pair node 214). For example, the first circuit die 202 (e.g., an advanced technology process node 212) having a first metal stack 206 and a second circuit die 204 (e.g., a pair node 214 that can be an older technology process node) having a second metal stack 208 can be connected to the first metal stack 206 of the first circuit die 202 (e.g., by face to face or face to back hybrid bonding 210).

Figure 3:
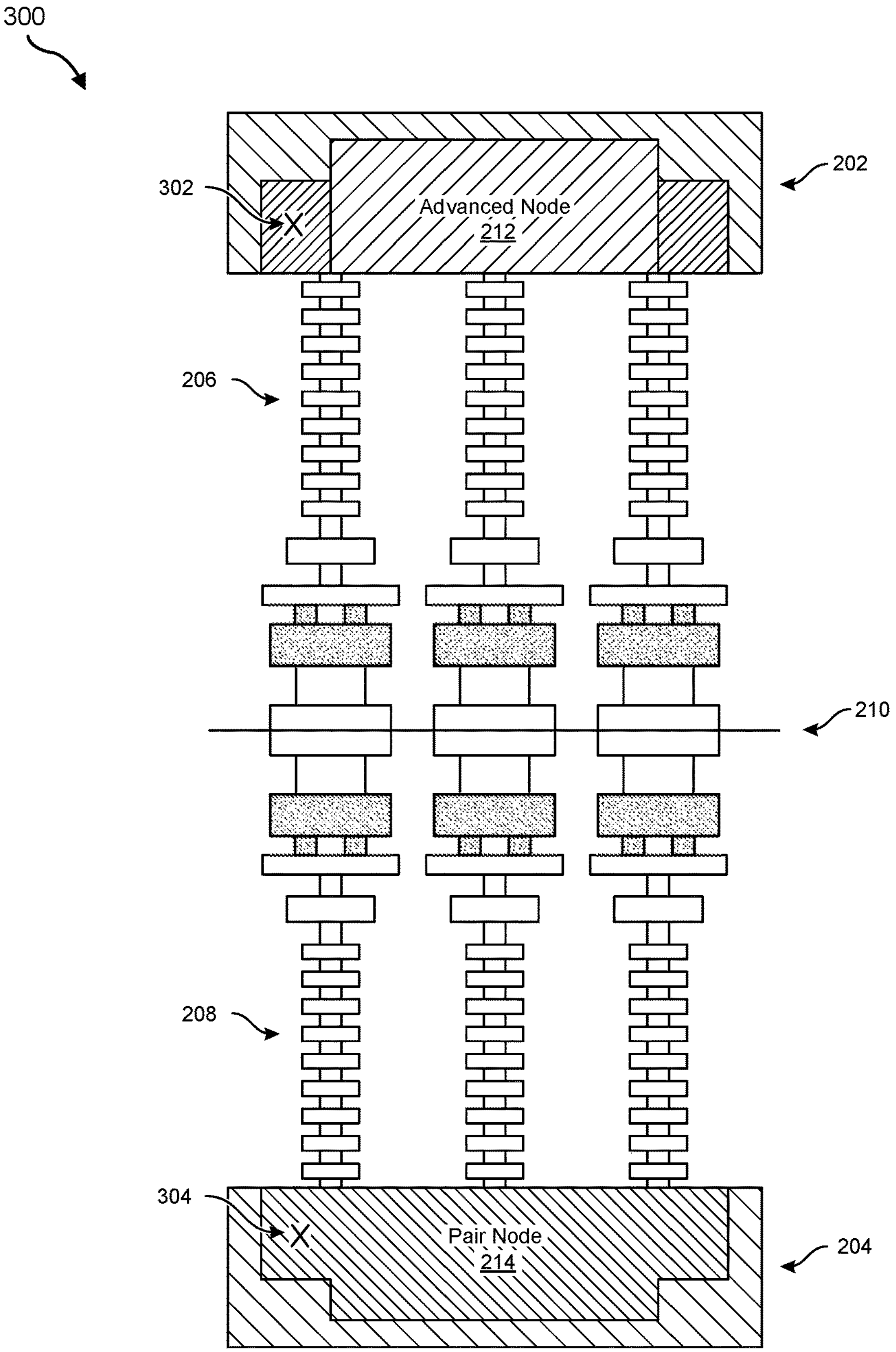
FIG. 3 is a block diagram illustrating an example integrated circuit including an advanced node and a pair node with face to face hybrid bonded metal stacks and one or more temperature sensors located in the pair node.

Referring to FIG. 3, an example integrated circuit 300 can have the features described above with reference to integrated circuit 200 of FIG. 2. For example, integrated circuit 300 can include first circuit die 202 (e.g., an advanced technology process node 212) having first metal stack 206 and second circuit die 204 (e.g., a pair node 214 that can be an older technology process node) having a second metal stack 208 connected to the first metal stack 206 of the first circuit die 202 (e.g., by face to face or face to back hybrid bonding 210). Additionally, optimizing the advanced node for logic devices can involve moving some non-logic devices to the pair node 214. For example, electronic design automation (EDA) modeling can be used to predict a hot spot 302 in a transistor layer of the advanced technology process node 212 (e.g., core compute die (CCD)) and a corresponding hot spot location in the pair node 214. A temperature sensor 304 can be positioned in a transistor layer of the pair node 214 in planar proximity (e.g., directly below) the hot spot 302 in the transistor layer of the advanced technology process node 212. With this placement, spacing out the logic transistors in the advanced technology process node 212 can be avoided without placing the temperature sensor 304 far from the hot spot. In alternative implementations, the advanced technology process node 212 can be located below the pair node 214, in which case the position of the hot spot 302 can be in the bottom die and the temperature sensor 304 can be placed in the top die (e.g., directly above the hot spot 302). However, locating the advanced technology process node 212 above the pair node 214 can yield heat dissipation benefits for the advanced technology process node 212 as later detailed herein with reference to FIG. 7.

Figure 4:
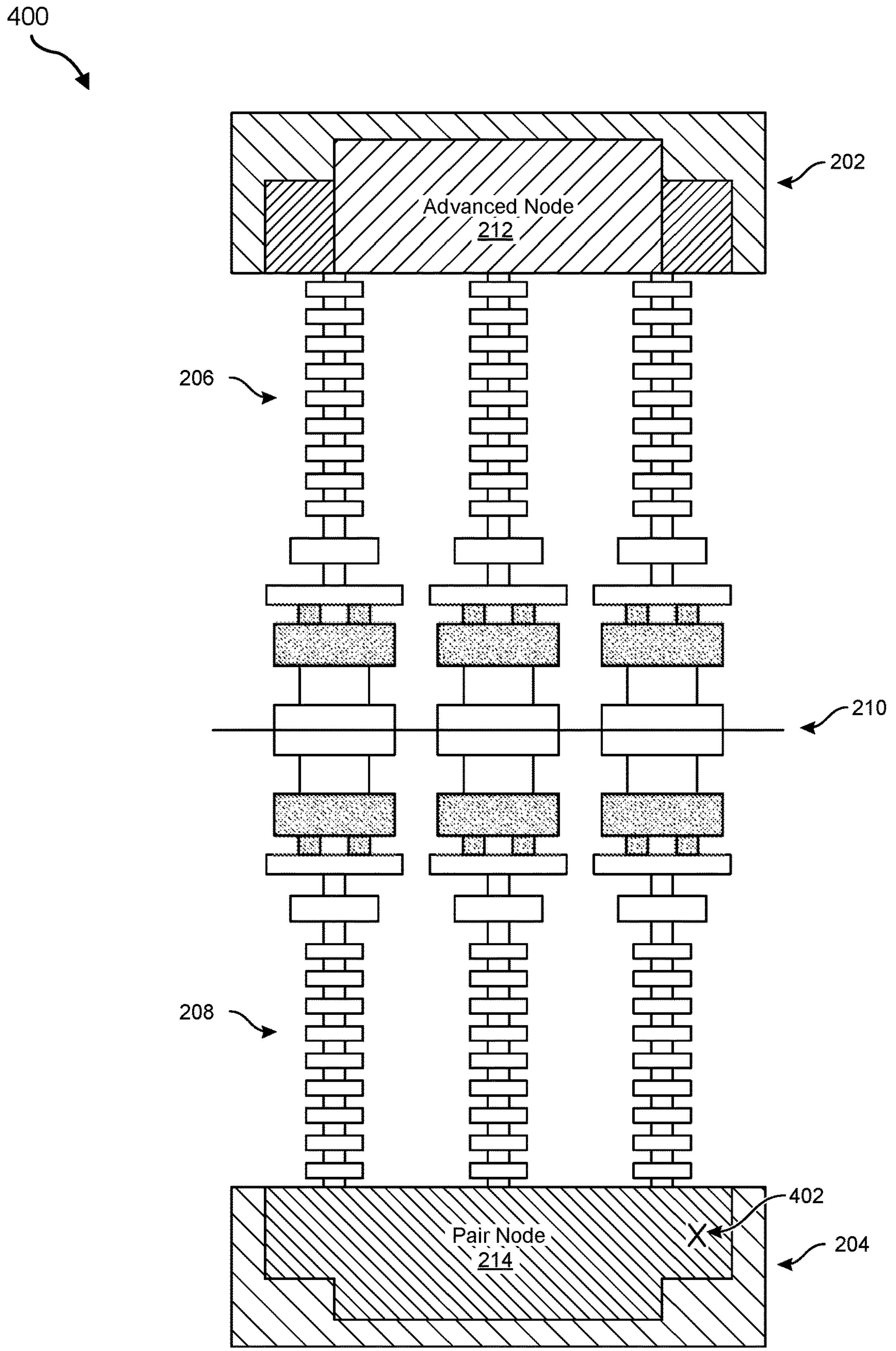
FIG. 4 is a block diagram illustrating an example integrated circuit including an advanced node and a pair node with face to face hybrid bonded metal stacks and one or more fuses and/or phase locked loop circuits located in the pair node.

Referring to FIG. 4, an example integrated circuit 400 can have the features described above with reference to integrated circuit 200 of FIG. 2 and/or integrated circuit 300 of FIG. 3. For example, integrated circuit 400 can include first circuit die 202 (e.g., an advanced technology process node 212) having first metal stack 206 and second circuit die 204 (e.g., a pair node 214 that can be an older technology process node) having a second metal stack 208 connected to the first metal stack 206 of the first circuit die 202 (e.g., by face to face or face to back hybrid bonding 210). Additionally, optimizing the advanced node 212 for logic devices can involve moving some non-logic devices to the pair node 214. As described herein, fuses 402 normally placed in a transistor layer of a die to identify the die can be moved from the advanced node 212 to the pair node 214. Die-to-die fuse value distribution paths can be provisioned to the advanced process die of advanced node 212 so that die identification for the advanced process die can be derived from its coordinates in a wafer rather than through programmed fuses. Additionally or alternatively, one or more phase lock loop circuits can be moved from the advanced node 212 to the pair node 214 in a similar manner. Such phase lock loop circuits can be useful for clock signal generation during high speed, standalone testing.

Figure 5:
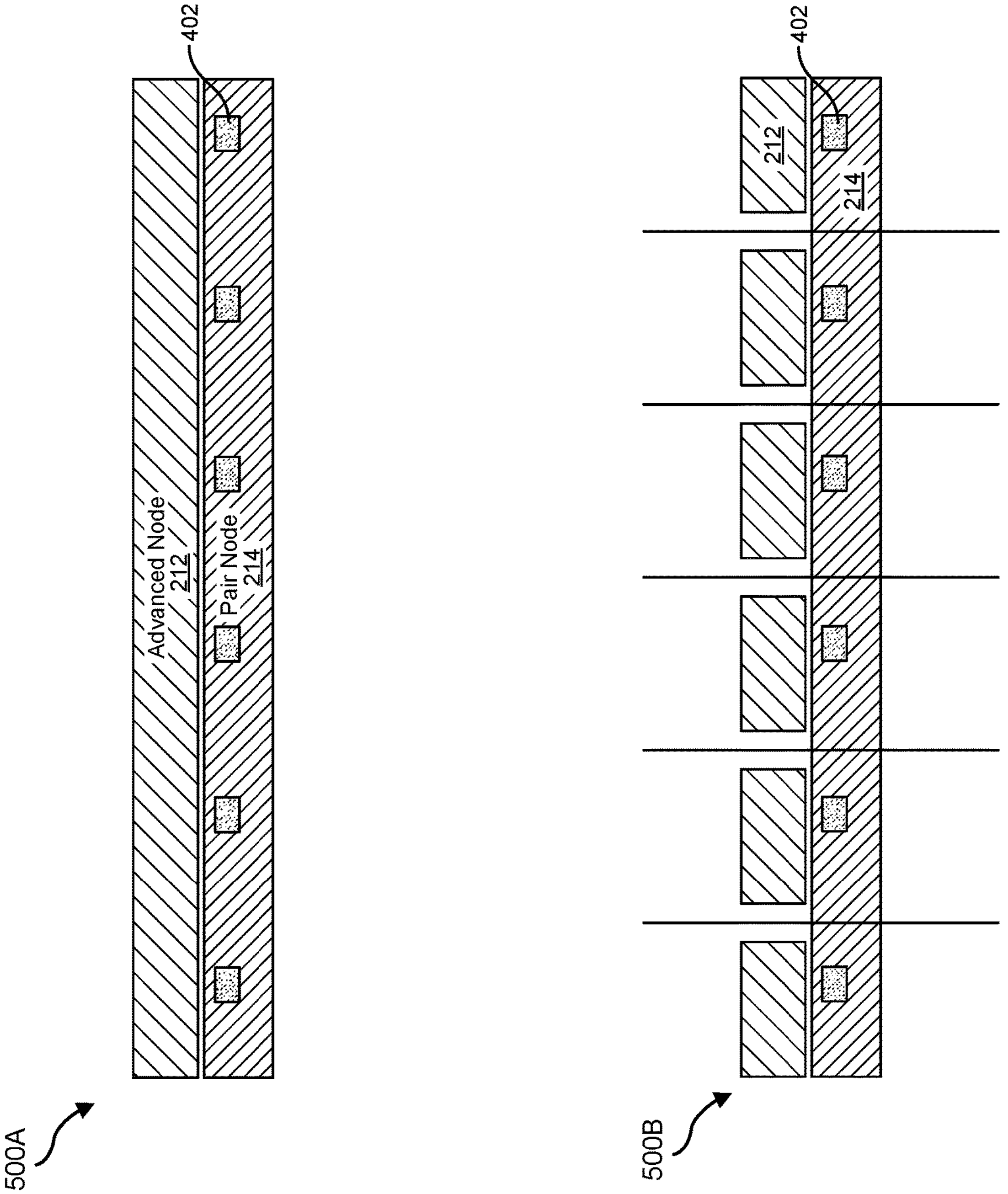
FIG. 5 is a block diagram illustrating wafer on wafer and chip on wafer processes.

Referring to FIG. 5, a wafer on wafer process 500A and a chip on wafer process 500B can be used to produce a die pair device such as the devices described herein with reference to FIGS. 2-4 and 7-25. For example, in wafer on wafer process 500A, placing fuses 402 and/or other non-logic components (e.g., phase lock loop circuits) exclusively on the pair process die can be relatively straightforward because die identification is only necessary after the wafers for the pair node 214 and advanced node 212 are bonded. As a result, the fuses 402 can be placed on the pair process die while provisioning fuse value distribution paths to the advanced process die, and similar provisioning can be performed for other non-logic components. However, in chip on wafer process 500B, placing fuses 402 and/or other non-logic components exclusively on the pair process die can be more complicated as the "chip" portion of the chip on wafer pair needs to support die identification and, for a number of reasons (e.g., thermal), the advanced process die often needs to be the top die in a 3D assembly. However, placing most or all of the fuses and/or other non-logic components in the pair process die and using the pair process die as the base wafer fails to retain the identification and tracking capability for the advanced process die that have already been diced into chips.

Figure 6:
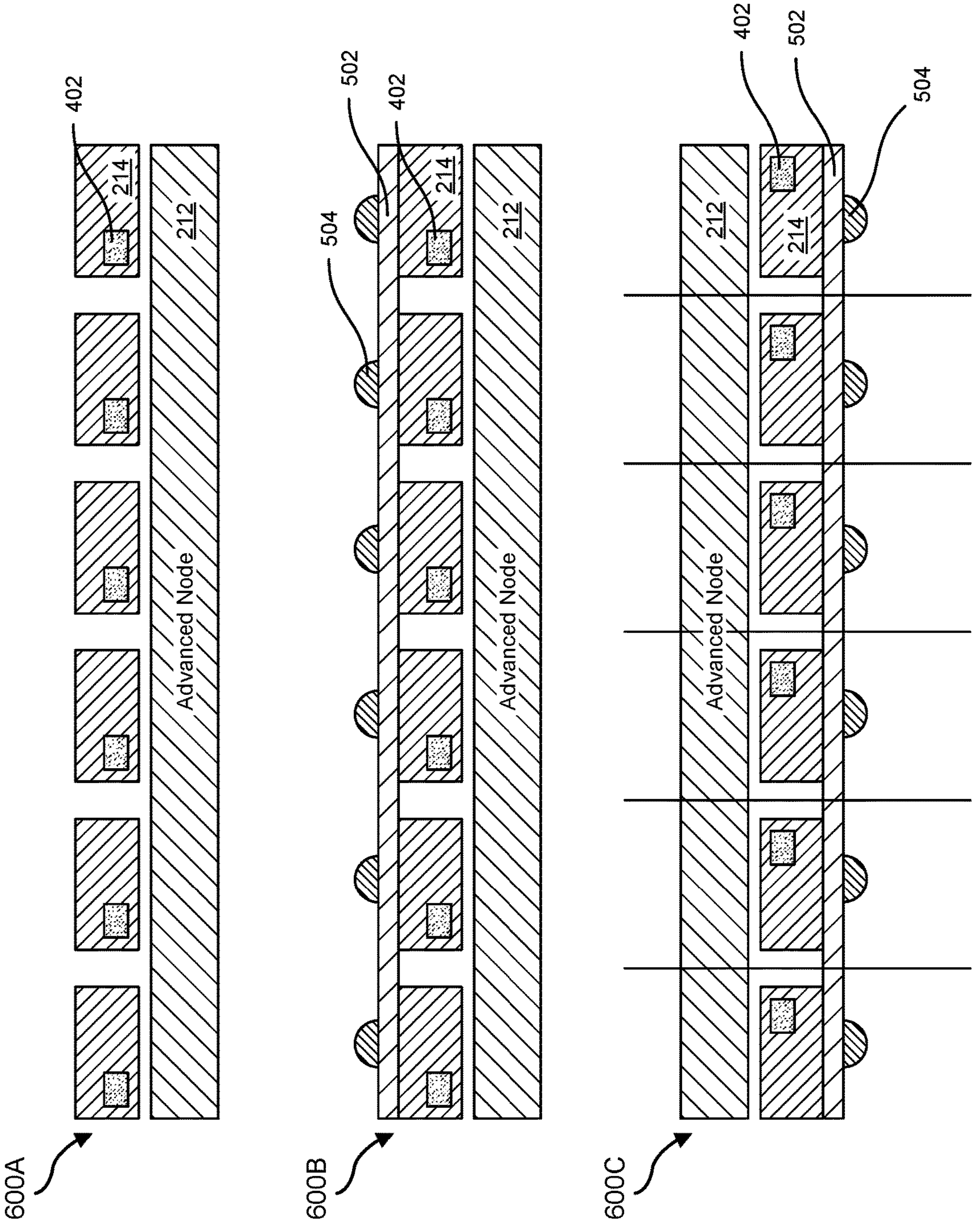
FIG. 6 is a block diagram illustrating chip on wafer processes that avoid placing fuses on advanced die optimized for logic.

FIG. 6 illustrates chip on wafer processes 600A-600C that avoid placing fuses 402 and/or other non-logic components on advanced die optimized for logic. For example, at chip on wafer process 600A, the pair die of pair node 214 can have the fuses 402 and/or other non-logic components placed thereon and already be diced into chips for placement on the advanced process die of advanced node 212 that can be used as the base wafer. Then, one or more interface metal layers 502 can be added atop the pair die and bumped 504 in chip on wafer process 600B. Thereafter, the resulting assembly can be flipped over and diced at chip on wafer process 600C so that the advanced process die becomes the top die.

Figure 7:
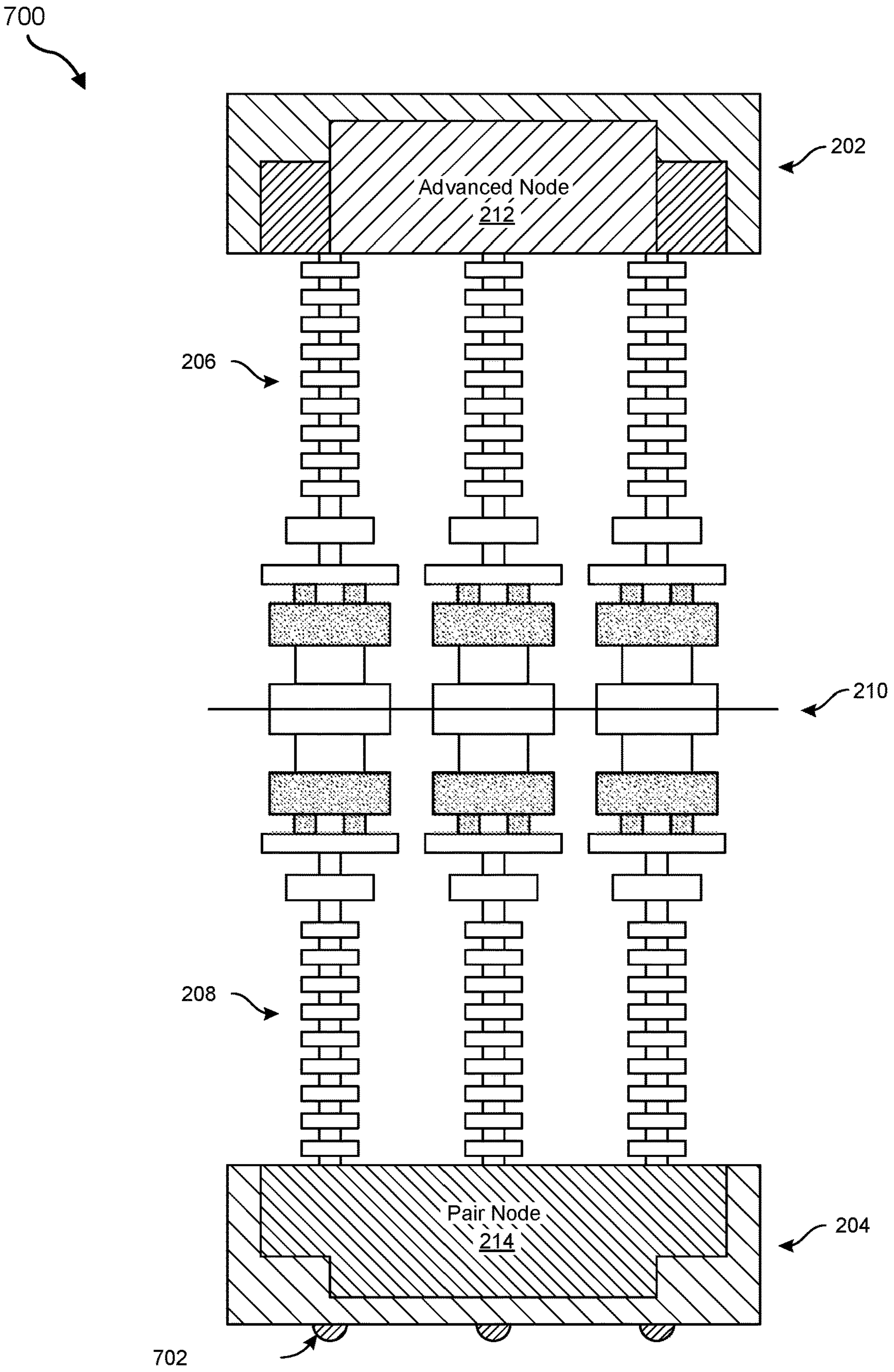
FIG. 7 is a block diagram illustrating an example integrated circuit including an advanced node and a pair node with hybrid bonded metal stacks and connection elements provided to the pair node.

Referring to FIG. 7, an example integrated circuit 700 can have the features described above with reference to integrated circuit 200 of FIG. 2, integrated circuit 300 of FIG. 3, and/or integrated circuit 400 of FIG. 4. For example, integrated circuit 400 can include first circuit die 202 (e.g., an advanced technology process node 212) having first metal stack 206 and second circuit die 204 (e.g., a pair node 214 that can be an older technology process node) having a second metal stack 208 connected to the first metal stack 206 of the first circuit die 202 (e.g., by face to face or face to back hybrid bonding 210). Additionally, with the node specialization described above, the first circuit die 202 can correspond to the advanced technology process node 212 that is the primary thermal source of the integrated circuit 700. Also, the second circuit die 204 can correspond to the pair node 214 that can be an older technology process node compared to the advanced technology process node 212 corresponding to the first circuit die 202. By providing connection elements 702 (e.g., backside vias, through silicon vias, direct bonding, micro bumps, one or more routing layers in the second circuit die 204 configured for connection to an active interposer die and/or package substrate, etc.) to the pair node 214, the pair node 214 can be connected to an IO die (e.g., active interposer die) and/or package substrate. In this way, the advanced technology process node 212 that is the primary thermal source of the integrated circuit 700 can be placed further away from the IO die and/or package substrate, but closer to semiconductor package thermal interface material (TIM) and thermal solution (e.g., heat spreader), thus achieving benefits in heat dissipation for the advanced technology process node 212 corresponding to the first circuit die 202.

Figure 8:
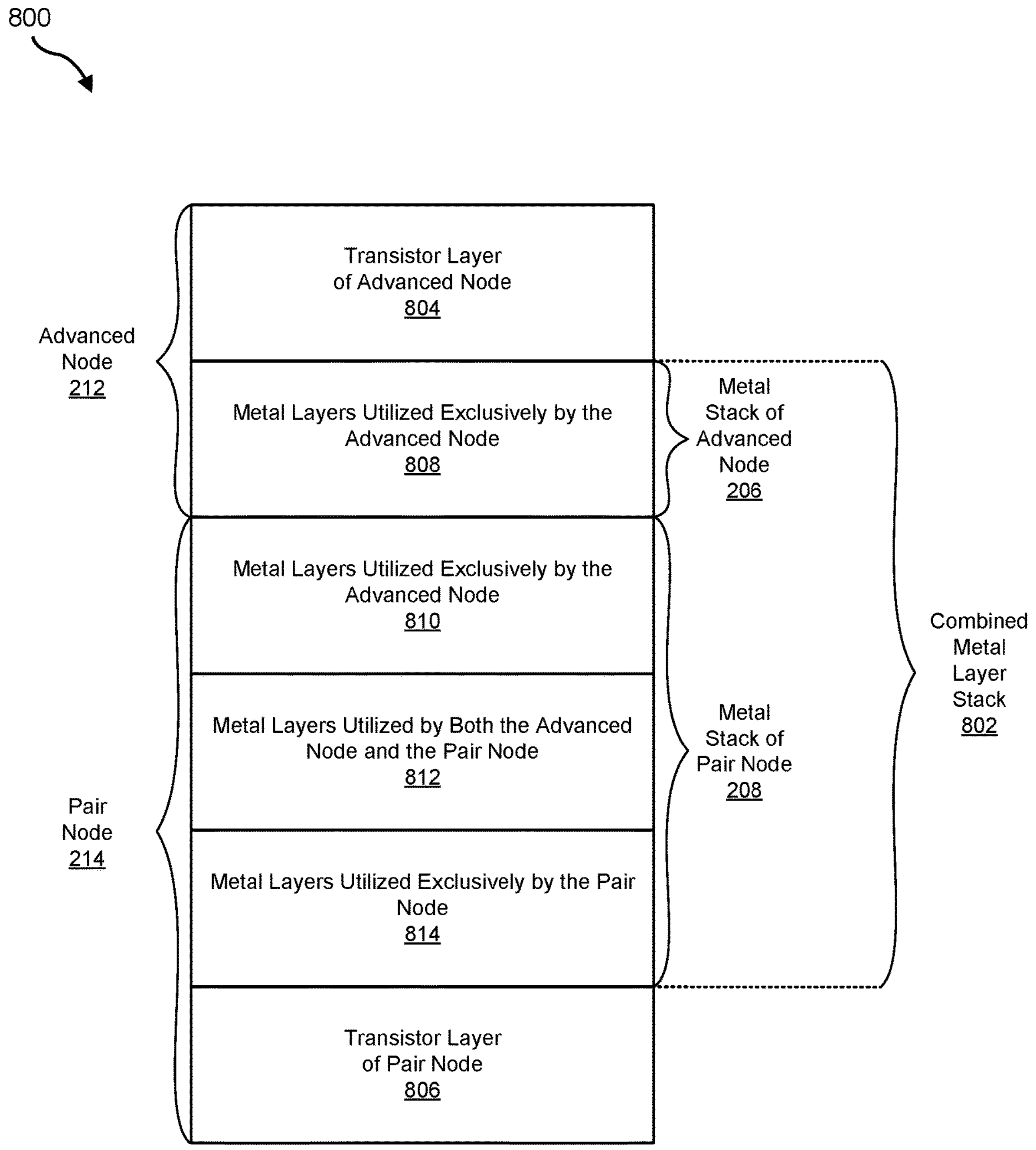
FIG. 8 is a block diagram illustrating an example integrated circuit including a first circuit die and a second circuit die with combined metal stacks having shared metal layers.

Referring to FIG. 8, an example integrated circuit 800 can have the features described above with reference to integrated circuit 200 of FIG. 2, integrated circuit 300 of FIG. 3, integrated circuit 400 of FIG. 4, and/or integrated circuit 700 of FIG. 7. For example, integrated circuit 800 can include first circuit die (e.g., an advanced technology process node 212) having first metal stack 206 and second circuit die (e.g., a pair node 214 that can be an older technology process node) having a second metal stack 208 connected to the first metal stack 206 of the first circuit die (e.g., by face to face or face to back hybrid bonding). Alternatively, integrated circuit 800 can include paired die that are not partitioned in a manner that optimizes one node as an advance node 212 and the other node as a pair node 214. In any event, the first circuit die and the second circuit die can have metal stacks 206 and 208 that are connected by face to face hybrid bonding into a combined metal layer stack 802.

The face to face hybrid bonding of the metal stacks 206 and 208 of the first and second circuit die can allow metal connectivity to be shared between the first circuit die and the second circuit die. This sharing of metal connectivity further allows redundant elements (e.g., metal layers) of the combined metal layer stack 802 to be eliminated from the combined stack 802. Thus, a total number of metal layers can be reduced compared to face to back or Si-metal-Si-metal stacking. For example, normal die metal stacks have N metal layers and standard stacking of two die results in 2×N metal layers. With the disclosed shared metal layer stack 802, the metal connectivity can be shared between the two die in such a manner that one or more (e.g., most or all) redundant metal layers are eliminated, resulting in <2N metal layers. In addition, at least some of the final layers to protect the die (e.g., passivation and bump) are not needed as the top of the metal stack is now embedded within the two die rather than being exposed as with a standard single die. Thus, an implementation can be a <2×N metal stack configuration of the two die.

As shown in FIG. 8, combined metal layer stack 802 can extend between a transistor layer 804 of the advanced node 212 and a transistor layer 806 of the pair node 214. Combined metal layer stack 802 include different categories of metal layers, such as a first portion 808 of metal layers utilized exclusively by the advanced node 212, a second portion 810 of metal layers utilized exclusively by the advanced node 212, metal layers 812 utilized by both the advanced node 212 and the pair node 214, and metal layers 814 utilized exclusively by the pair node 214. A circuit die normally contains all of the metal layers that it exclusively utilizes plus one or more metal layers that it uses to communicate with other die. However, as shown in FIG. 8, combined metal layer stack 802 can eliminate one or more redundant metal layers in at least two ways. Firstly, metal layers 812 utilized by both the advanced node 212 and the pair node 214 can be eliminated from the advanced node 212 and/or moved from the advanced node 212 to the pair node 214 where they can be implemented at reduced cost. Secondly, second portion 810 of metal layers utilized exclusively by the advanced node 212 can be relocated from the advanced node 212 to the pair node 214 where they can be implemented at reduced cost. Thus, a signal can route from a transistor layer 804 the advanced node 212 into second portion 810 of metal layers utilized exclusively by the advanced node 212 and therefrom back to the advanced node 212 without communication of the signal to a transistor layer 806 of the pair node 214. Accordingly, cost can be reduced by entirely eliminating one or more redundant metal layers from the combined metal stack, by relocating one or more metal layers form the first metal stack 206 to the second metal stack 208, and/or by reduced passivation layers. Additional benefits can include improved performance, reduced power, and improved reliability.

Figure 9:
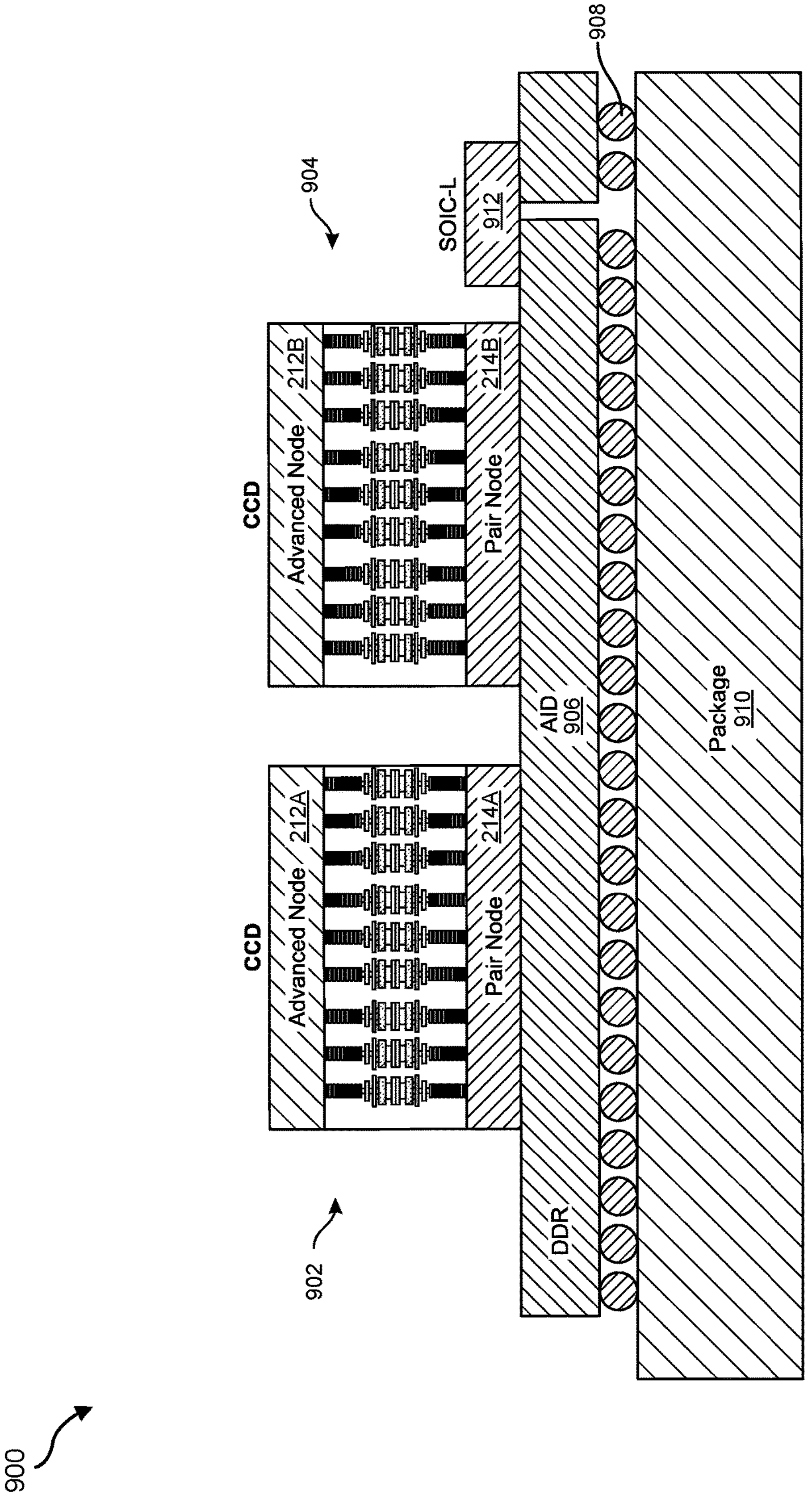
FIG. 9 is a block diagram illustrating an example semiconductor device.

FIG. 9 illustrates an example semiconductor device 900. For example, semiconductor device 900 can include one or more integrated circuits 902 and 904, such as integrated circuit 200 of FIG. 2, integrated circuit 300 of FIG. 3, integrated circuit 400 of FIG. 4, integrated circuit 700 of FIG. 7, and/or integrated circuit 800 of FIG. 8. The one or more integrated circuits 902 and 904 can include a first circuit die corresponding to advanced node 212 and having a first metal stack and a second circuit die corresponding to a pair node 214 and having a second metal stack that is connected to the first metal stack of the first circuit die by hybrid bonding (e.g., face to face or face to back). Also, semiconductor device 900 can include connection elements (e.g., a passivation layer connected to the second circuit die and a plurality of bumps (e.g., micro bumps) connected to the passivation layer).

As mentioned above, semiconductor device 900 can include a first circuit die that corresponds to an advanced technology process node 212A and 212B and a second circuit die that corresponds to a pair node 214A and 214B, which can be an older technology process node compared to the advanced technology process node 212. Semiconductor device 900 can leverage a 3D-optimized process-pair of these nodes to enable the advanced technology process node 212A and 212B to provide compelling performance at lower cost and cycle time. The process-pair approach can yield numerous benefits, including streamlining of advanced technology process node devices (e.g., upper tier circuit die) to optimize for logic-only. Dense SRAM, analog, and less performance-critical logic can be implemented on the pair node 214A and 214B (e.g., lower tier circuit die), which can utilize N3p or N2 technology. Another benefit of the process-pair approach can be significantly higher density for higher performance firmware, enabling more compute capability.

Integrated circuits 902 and 904 can be connected to an active interposer die (AID) 906 by the micro bumps provided to the pair nodes. In turn, the AID 906 can connect (e.g., by bumps 908) to a semiconductor device package substrate 910. Additional circuit die, such as a small outline integrated circuit (SOIC) 912 can also be included in semiconductor device 900. As also mentioned above, the process-pair approach permits positioning of temperature sensors, fuses, and/or phase locked loop circuits in transistor layers of the pair nodes 214A and 214B rather than in the transistor layers of the advanced technology process nodes 212A and 212B, yielding numerous benefits. Further, the combined metal stacks of the process pair can have one or more redundant metal layers eliminated, yielding numerous benefits.

Figure 10:
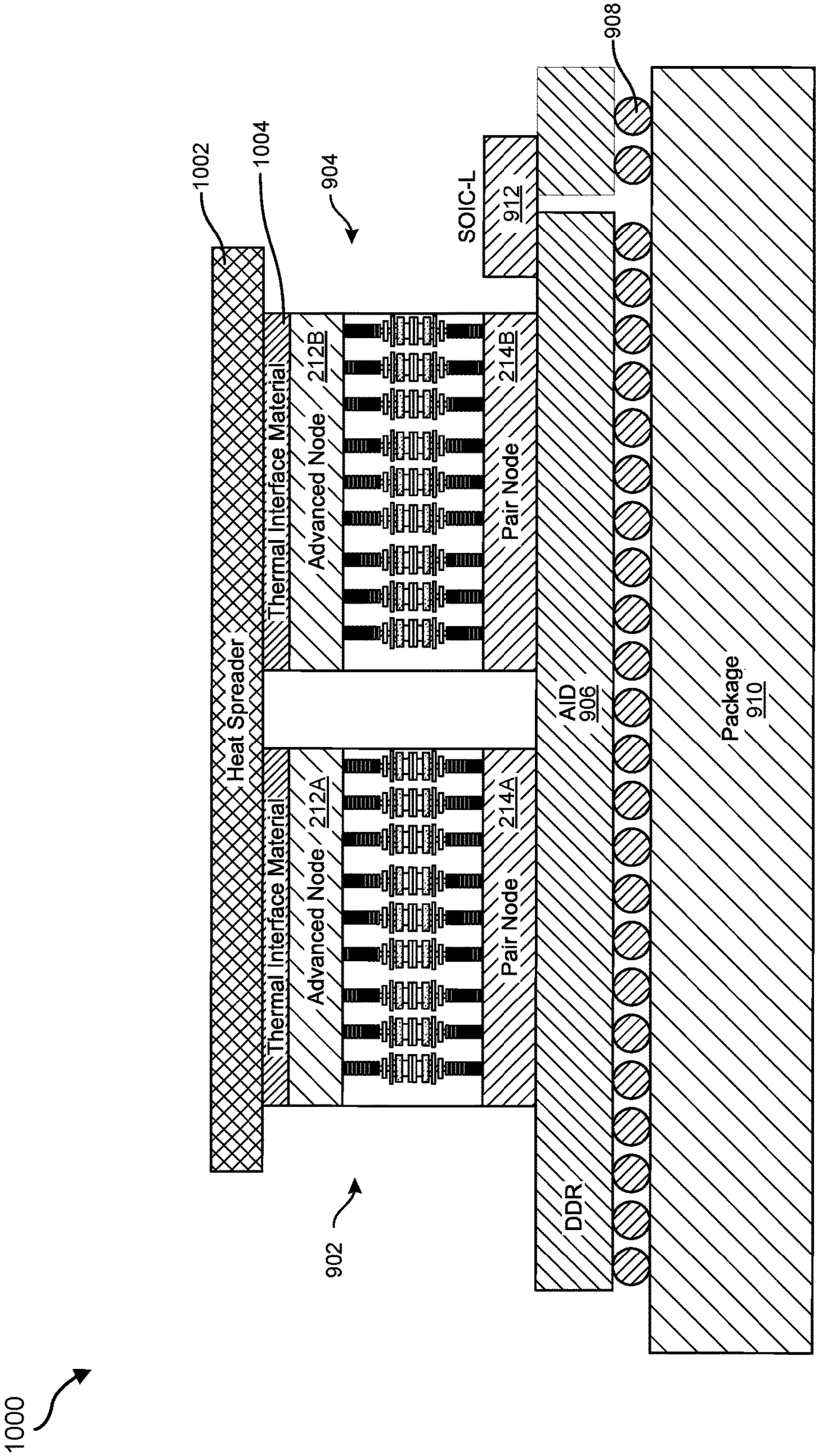
FIG. 10 is a block diagram illustrating an example semiconductor device and thermal solution.

FIG. 10 illustrates an example semiconductor device 1000 that can include any or all of the features of semiconductor device 900 of FIG. 9, such as advanced node 212A and 212B, pair node 214A and 214B, integrated circuits 902 and 904, AID 906, bumps 908, package substrate 910, and/or SOIC 912. Additionally, semiconductor device 1000 can include a heat spreader 1002 located above the advanced technology process node and thermal interface material (TIM) 1004 positioned between the heat spreader 1002 and the advanced technology process node 212A and 212B. Accordingly, the advanced technology process node 212A and 212B that is the primary thermal source of the integrated circuits 902 and 904 can be placed further away from the IO die, such as AID 906 and/or package substrate 910, but closer to semiconductor package thermal interface material (TIM) 1004 and thermal solution (e.g., heat spreader 1004), thus achieving benefits in heat dissipation for the advanced technology process node 212A and 212B corresponding to the first circuit die.

Figure 11:
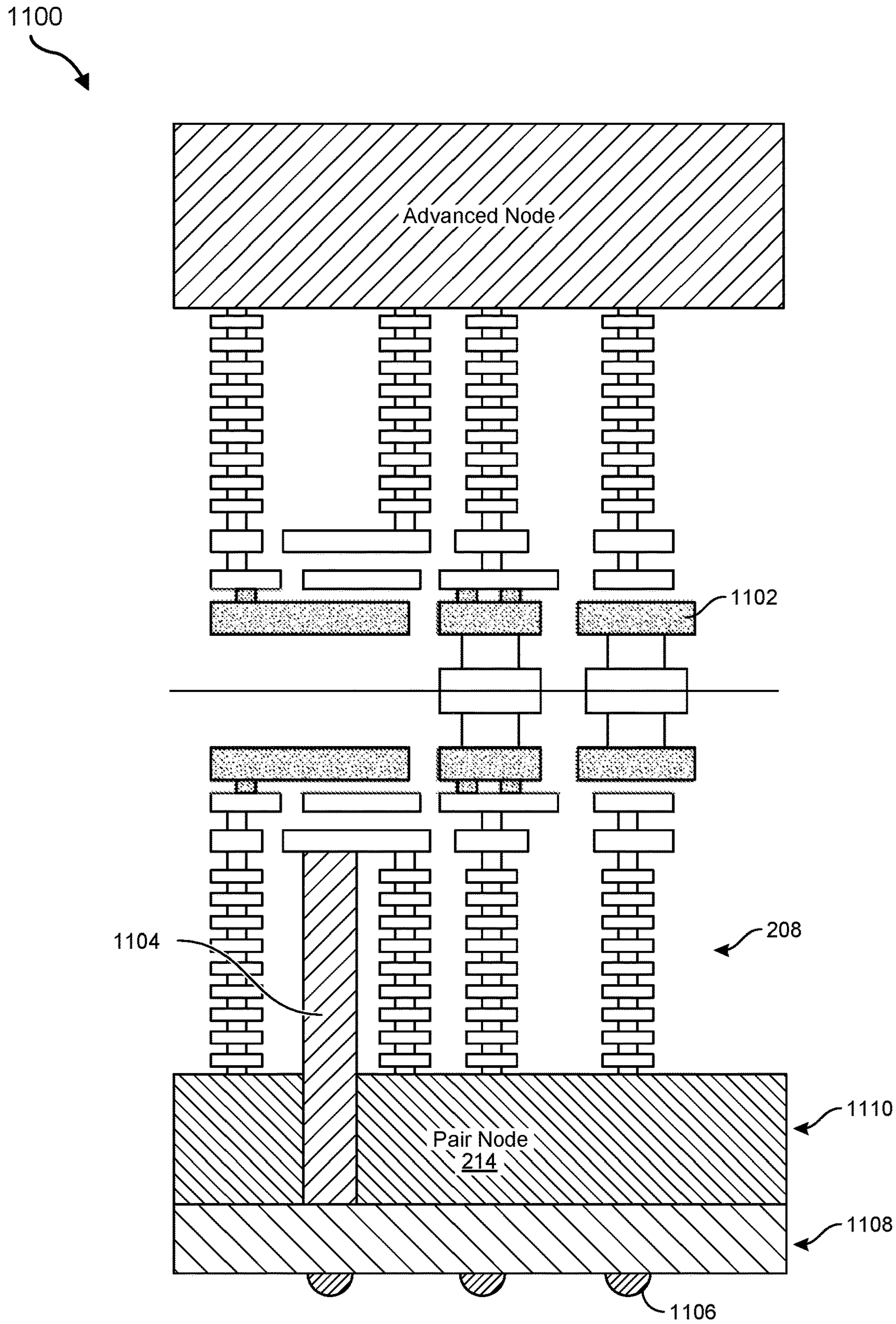
FIG. 11 is a block diagram illustrating an example semiconductor device that demonstrates a power delivery option.
Figure 12:
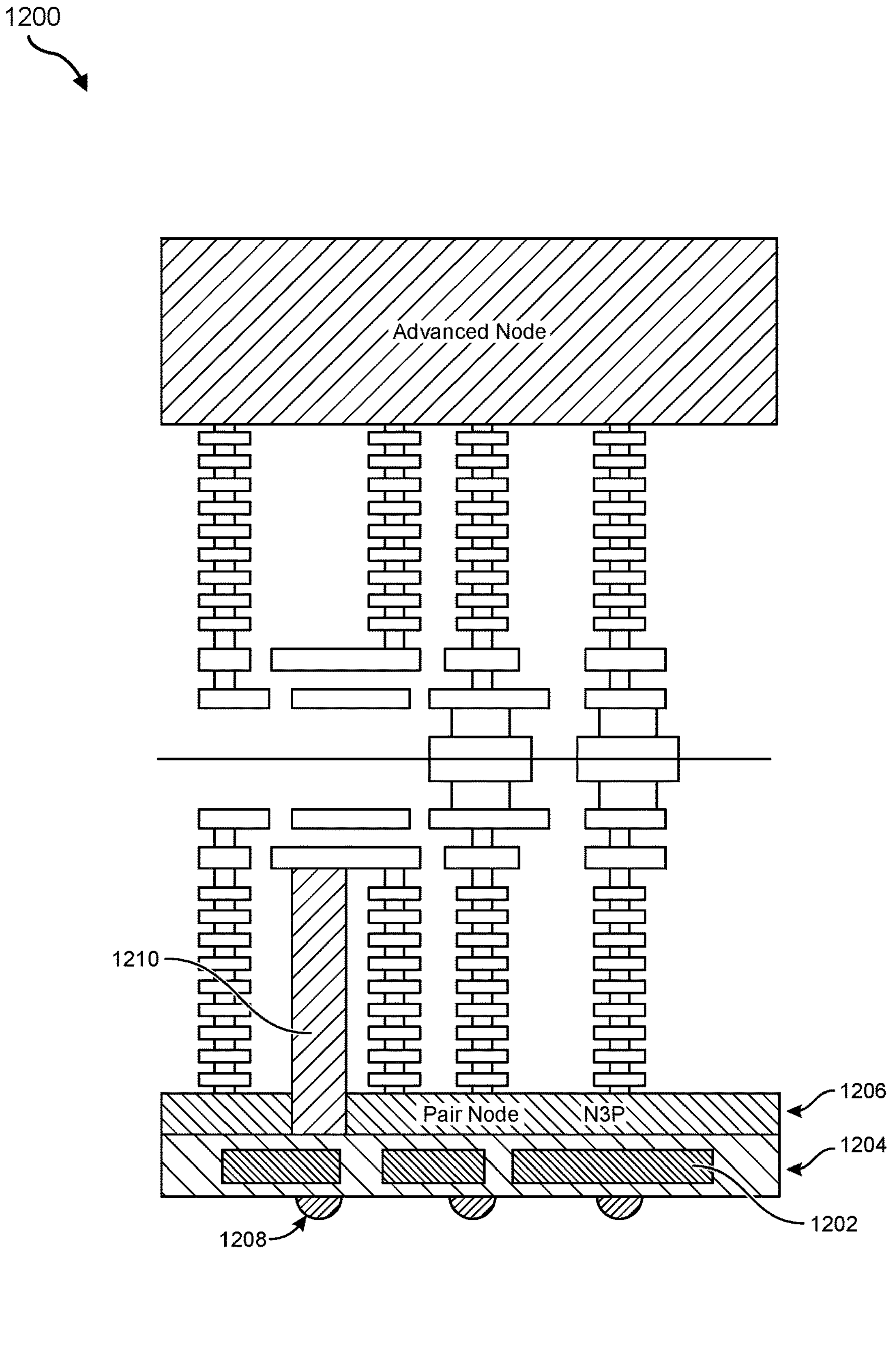
FIG. 12 is a block diagram illustrating an example semiconductor device that demonstrates a power delivery option.
Figure 13:
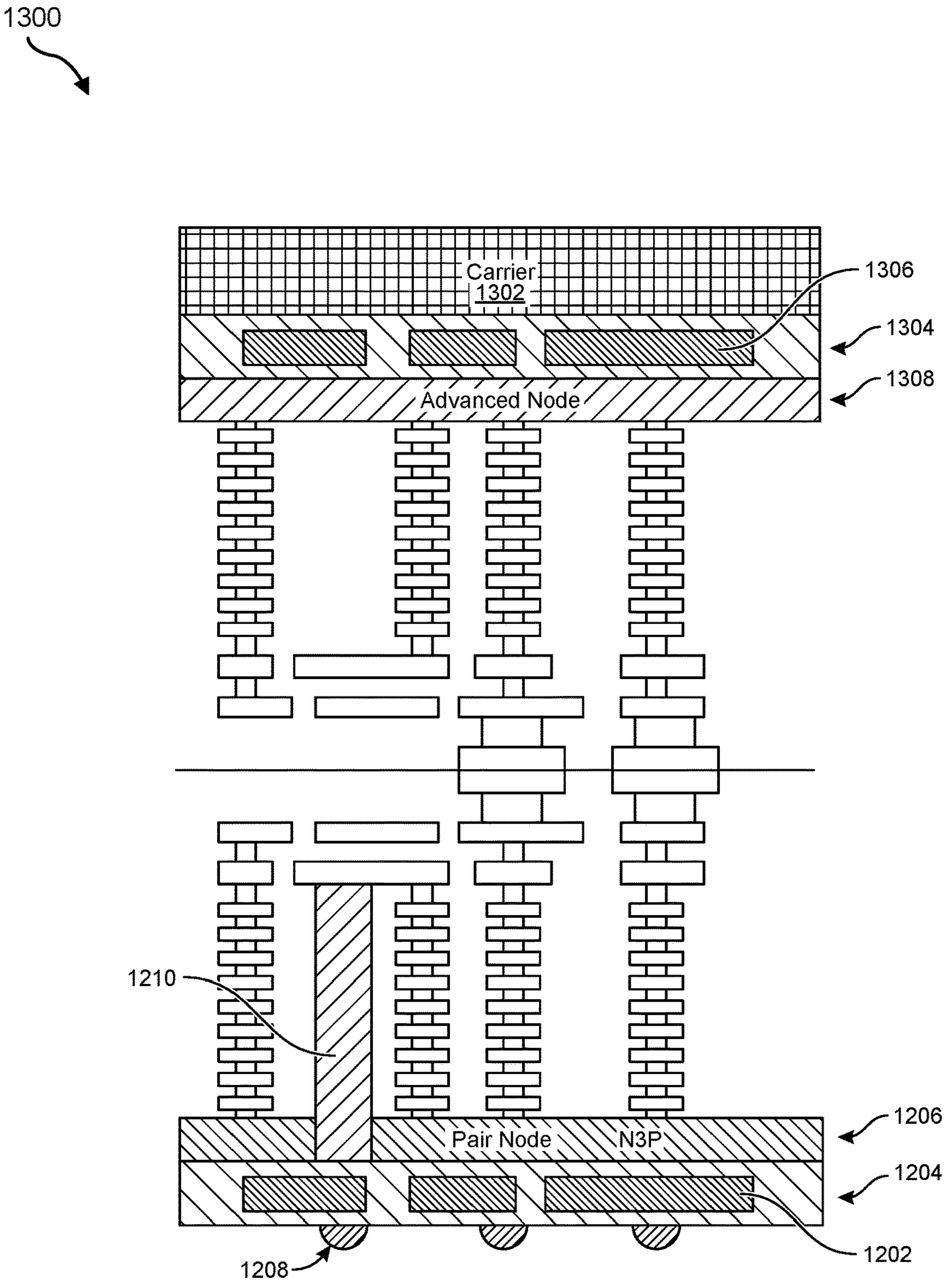
FIG. 13 is a block diagram illustrating an example semiconductor device that demonstrates a power delivery option.

FIGS. 11-13 illustrate example semiconductor devices 1100, 1200, and 1300 that demonstrate various power delivery options. Referring to FIG. 11, semiconductor device 1100 can include at least one copper redistribution layer (RDL) 1102 and a power curtain 1104 configured to convey power from connection elements 1106 and a passivation layer 1108 through a transistor layer 1110 of the second circuit die (e.g., pair node 214) to the second metal stack 208. Thus, an option for power delivery can include use of a redistribution layer 1102 and a power curtain 1104 that can correspond to one or more through silicon vias.

Referring to FIG. 12, semiconductor device 1200 can include a backside power delivery network 1202 (e.g., backside power rails) located in a passivation layer 1204 beneath a transistor layer 1206 of the second circuit die (e.g., pair node). With this configuration, the backside power delivery network 1202 can receive power through connection elements 1208 and supply power to a transistor layer 1206 of the second circuit die by backside vias and/or nano through silicon vias, and a power curtain 1210 can be eliminated. Thus, an option for power delivery can be to use a backside power delivery network 1202 located in a bottom tier of the semiconductor device 1200.

Referring to FIG. 13, semiconductor device 1300 can include a backside power delivery network 1202 (e.g., backside power rails) located in a passivation layer 1204 beneath a transistor layer 1206 of the second circuit die (e.g., pair node) and receive power from connection elements 1208 as described above with reference to semiconductor device 1200. Additionally, semiconductor device 1300 can include a top carrier 1302 and an additional passivation layer 1304 located between the first circuit die (e.g., advanced node) and the top carrier 1302. Also, semiconductor device 1300 can include an additional backside power delivery network 1306 located in the additional passivation layer 1304. With this configuration, the backside power delivery networks 1202 and 1306 can supply power to transistor layers 1204 and 1308 of the first circuit die and the second circuit die by backside vias and/or nano through silicon vias, and the power curtain 1210 can be eliminated. Thus, an option for power delivery can be to use backside power delivery networks 1202 and 1306 located in top and bottom tiers of the semiconductor device 1300.

Figure 14:
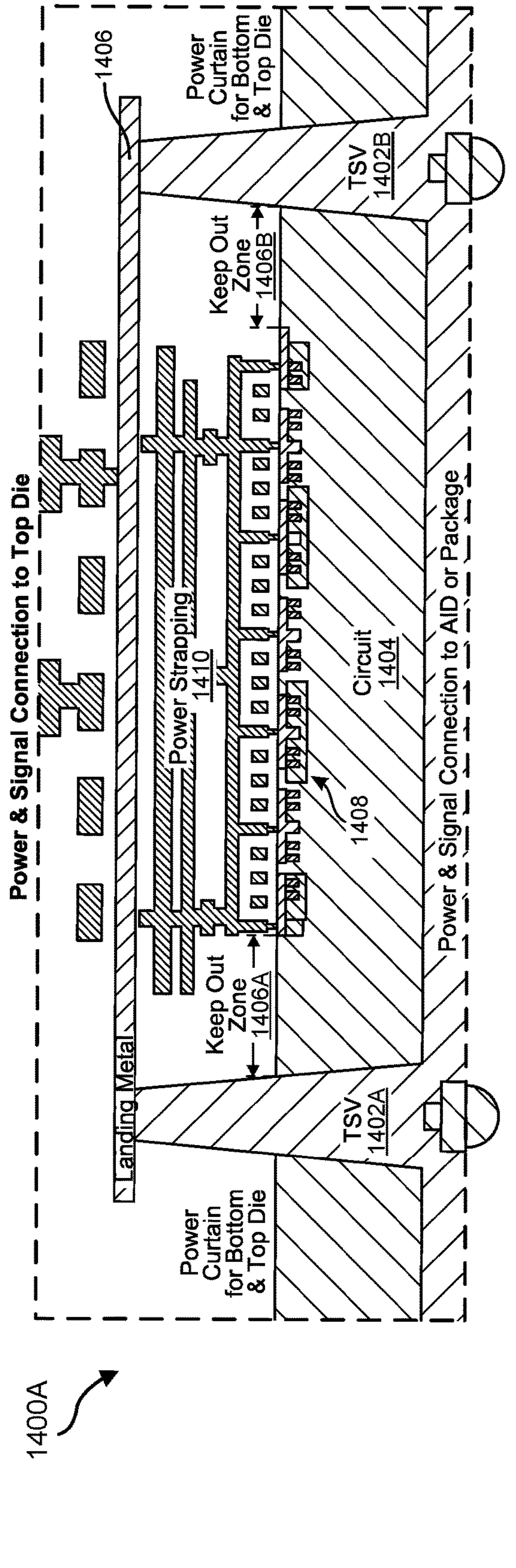
FIG. 14 is a block diagram illustrating bottom die that show details of power curtains with through silicon vias and backside power delivery networks.
Figure 14:
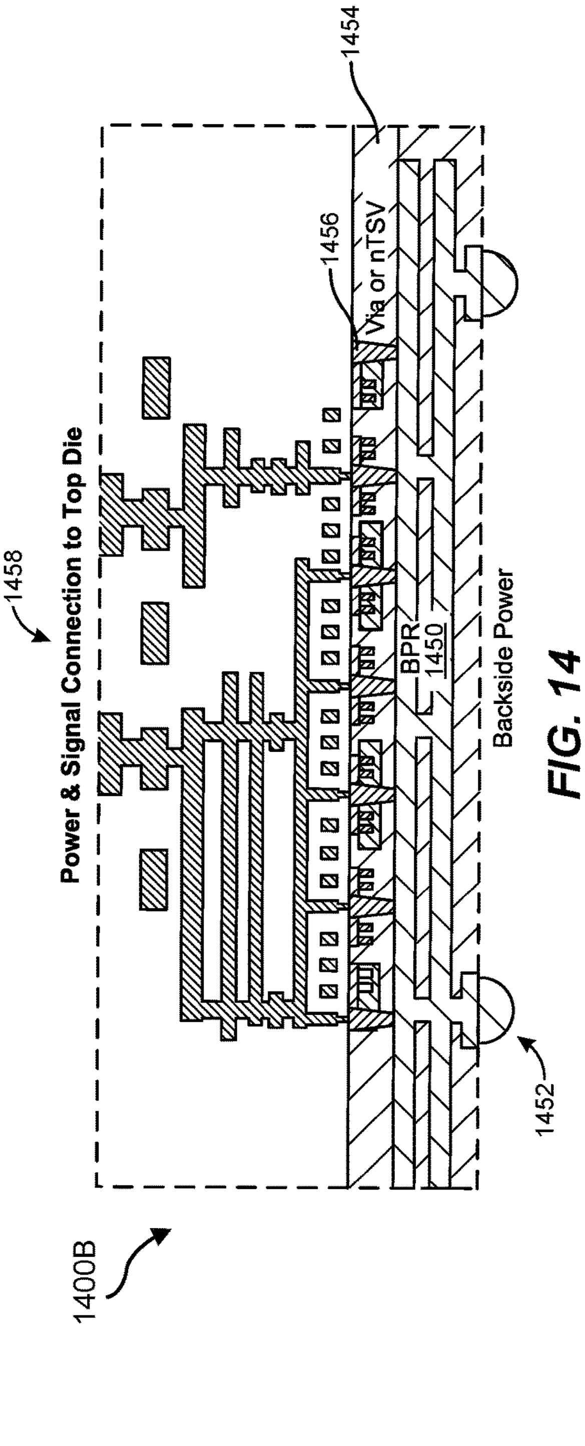

Referring to FIG. 14, bottom die 1400A and 1400B are shown in greater detail. For example, bottom die 1400A shows a bottom die that does not have backside power, and that requires one or more power curtains (e.g., TSVs) 1402A and 1402B through the transistor layer (e.g., circuit 1404) to a landing metal 1406 in a metal stack on a front side of the die. These power curtains 1402A and 1402B require keep out zones 1406A and 1406B that space the power curtains 1402A and 1402B apart from active elements 1408 of the transistor layer, thus increasing a size of the bottom die 1400A to prevent device degradation and resulting in higher cost. Also, delivering power to the circuit 1404 from the landing metal 1406 through the power strapping 1410 (e.g., metal stacks) on the front side of the die 1400A requires additional connection and potential performance impact with additional IR drop.

In contrast to bottom die 1400A, bottom die 1400B has a backside power delivery network 1450 that directly receives power from connection elements 1452 and delivers power to the transistor layer 1454 from an active interposer die or package substrate through micro bumps and backside vias or nano TSVs 1456 that do not require keep out zones. As a result, a size of the bottom die 1400B can be reduced and delivery of power to the circuit from a landing metal through power strapping (e.g., metal stacks) on the front side of the die 1400B can be avoided. Thus, the backside power delivery network 1450 can provide power directly to the transistor layer 1454 of the bottom die 1400B while avoiding higher costs, potential performance impact, and additional IR drop that results from use of power curtains that require keep out zones and deliver power first to the front side of a bottom die. The power provided directly to the transistor layer 1454 of the bottom die 1400B can also pass through the bottom die 1400B and provide power to a top die through the front side of the bottom die 1400B by power and signal connections 1458 to the top die. Alternatively or additionally, a same or similar backside power delivery network 1450 can be provided to the top die, thus avoiding potential IR drop resulting from delivering power to the circuit (e.g., transistor layer) of the top die through power strapping (e.g., metal stacks) on the front side of the top die.

Figure 15:
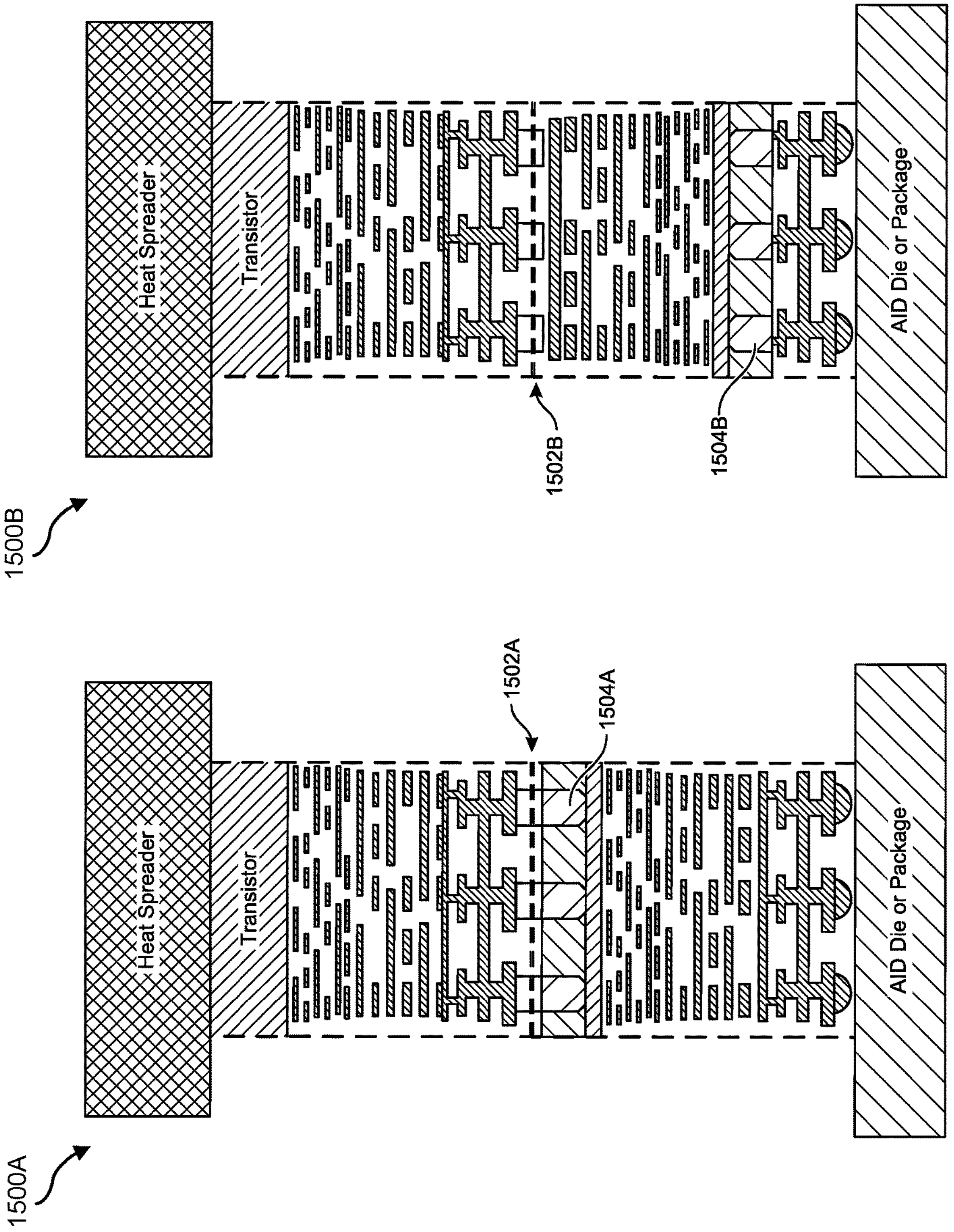
FIG. 15 is a block diagram illustrating semiconductor devices that include power curtains with through silicon vias that require keep out zones.

Referring to FIG. 15, semiconductor devices 1500A and 1500B can include top and bottom die that are hybrid bonded 1502A and 1502B and stacked face to back and face to face, respectively. Without backside power, both of semiconductor devices 1500A and 1500B utilize power curtains 1504A and 1504B (e.g., arrays of TSVs) that supply power to the top and bottom die.

Figure 16:
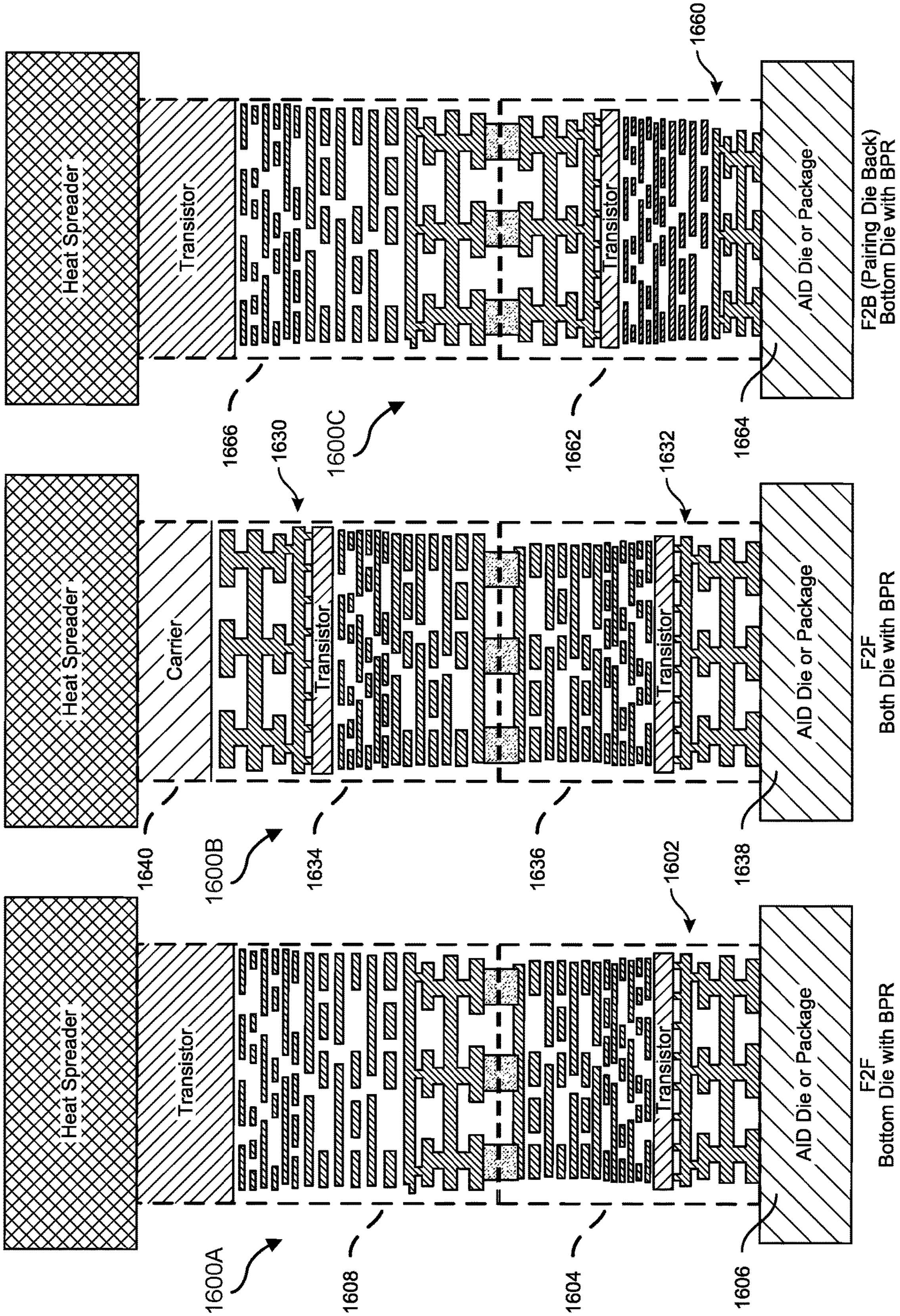
FIG. 16 is a block diagram illustrating semiconductor devices that include backside power delivery networks with hybrid bonding either face to face or face to back.

Referring to FIG. 16, semiconductor devices 1600A, 1600B, and 1600C can include top and bottom die that have metal stacks that are hybrid bonded to one another. For example, semiconductor devices 1600A and 1600B can be hybrid bonded face to face and semiconductor device 1600C can be hybrid bonded face to back with a face of the top die bonded to a back of the bottom die. Semiconductor devices 1600A, 1600B, and 1600C can implement the backside power delivery networks described above with reference to FIGS. 12-14. For example, semiconductor device 1600A can have a backside power delivery network 1602 located in a passivation layer of the bottom die 1604. This backside power delivery network 1602 can be configured to deliver power from an active interposer die and/or package substrate 1606 to both the top die 1608 and bottom die 1604 that have metal stacks that are face to face hybrid bonded to one another. Additionally, semiconductor device 1600B can have backside power delivery networks 1630 and 1632 located in passivation layers of the top die 1634 and bottom die 1636. The backside power delivery networks 1630 and 1632 can be configured to deliver power from an active interposer die and/or package substrate 1638 to the bottom die 1636 and from a top carrier 1640 to the top die 1634. Also, semiconductor device 1600C can have a backside power delivery network 1660 located in a passivation layer of the bottom die 1662. This backside power delivery network 1660 can be configured to deliver power from an active interposer die and/or package substrate 1664 to both the top die 1666 and bottom die 1662 that have metal stacks that are face to face hybrid bonded to one another. With any of these arrangements, semiconductor devices 1600A, 1600B, and 1600C can deliver power to their respective top and bottom die without use of arrays of through silicon vias (TSVs) (e.g., power curtains) through the circuits (e.g., transistor layers) of the bottom die.

Figure 17:
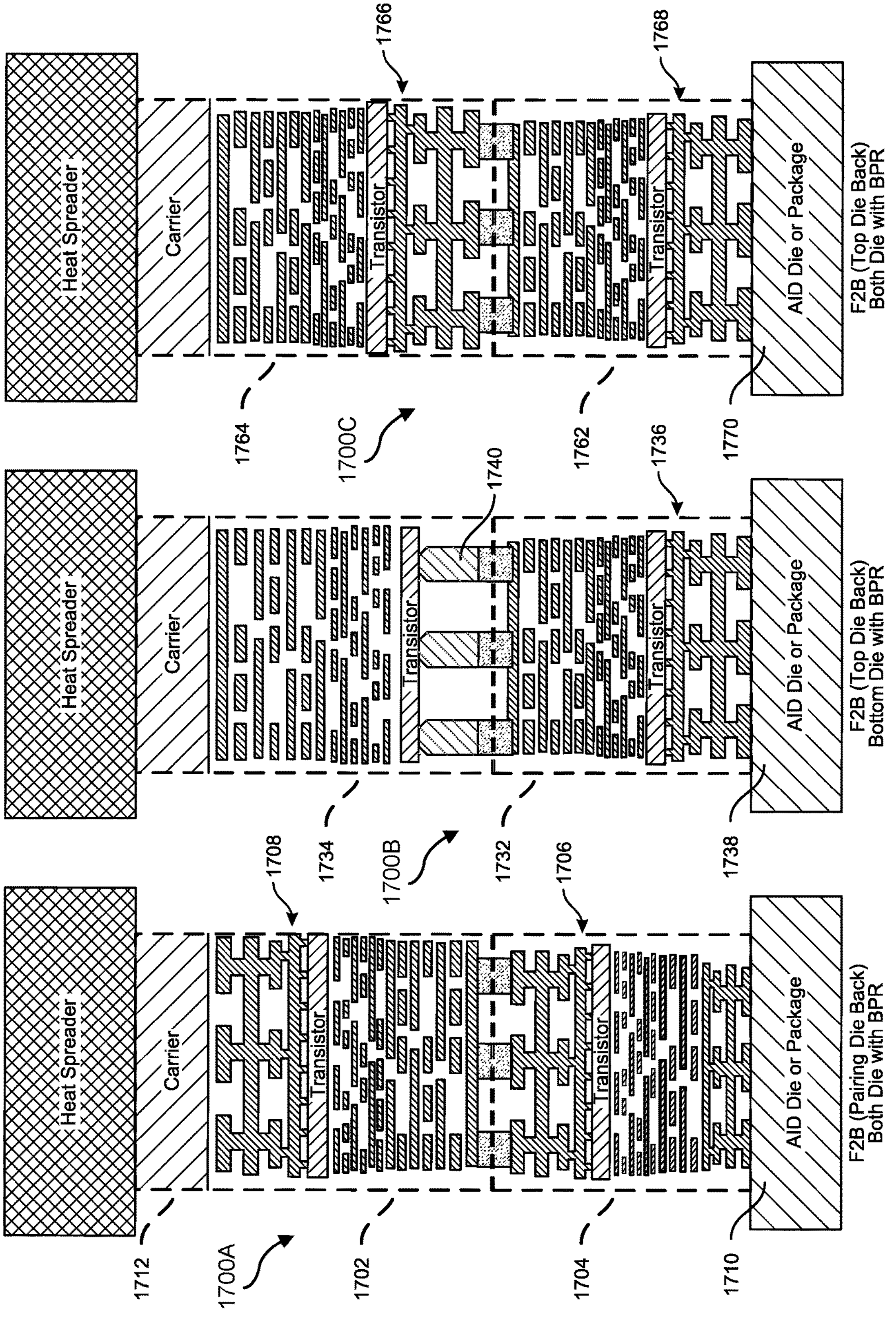
FIG. 17 is a block diagram illustrating semiconductor devices that include backside power delivery networks with hybrid bonding face to back.

Referring to FIG. 17, semiconductor devices 1700A, 1700B, and 1700C can include top and bottom die that have metal stacks that are hybrid bonded to one another face to back. For example, semiconductor device 1700A can bond the face of the top die 1702 to the back of the bottom die 1704. Additionally, semiconductor device 1700B can bond the face of the bottom die 1732 to the back of the top die 1734. Also, semiconductor device 1700C can bond the face of the bottom die 1762 to the back of the top die 1764.

Semiconductor devices 1700A, 1700B, and 1700C can implement the backside power delivery networks described above with reference to FIGS. 12-14. For example, semiconductor device 1700A can have backside power delivery networks 1706 and 1708 located in passivation layers of the top die 1702 and bottom die 1704. The backside power delivery networks 1706 and 1708 can be configured to deliver power from an active interposer die and/or package substrate 1710 to the bottom die 1704 and from a top carrier 1712 to the top die 1702. Additionally, semiconductor device 1700B can have a backside power delivery network 1736 located in a passivation layer of the bottom die 1732. This backside power delivery network 1736 can be configured to deliver power from an active interposer die and/or package substrate 1738 to both the top die 1734 and bottom die 1732 using power curtains 1740. Also, semiconductor device 1700C can have backside power delivery networks 1766 and 1768 located in passivation layers of the top die 1764 and bottom die 1762. The backside power delivery networks 1766 and 1768 can be configured to deliver power from an active interposer die and/or package substrate 1770 to the bottom die 1762 and to the top die 1764.

Figure 18:
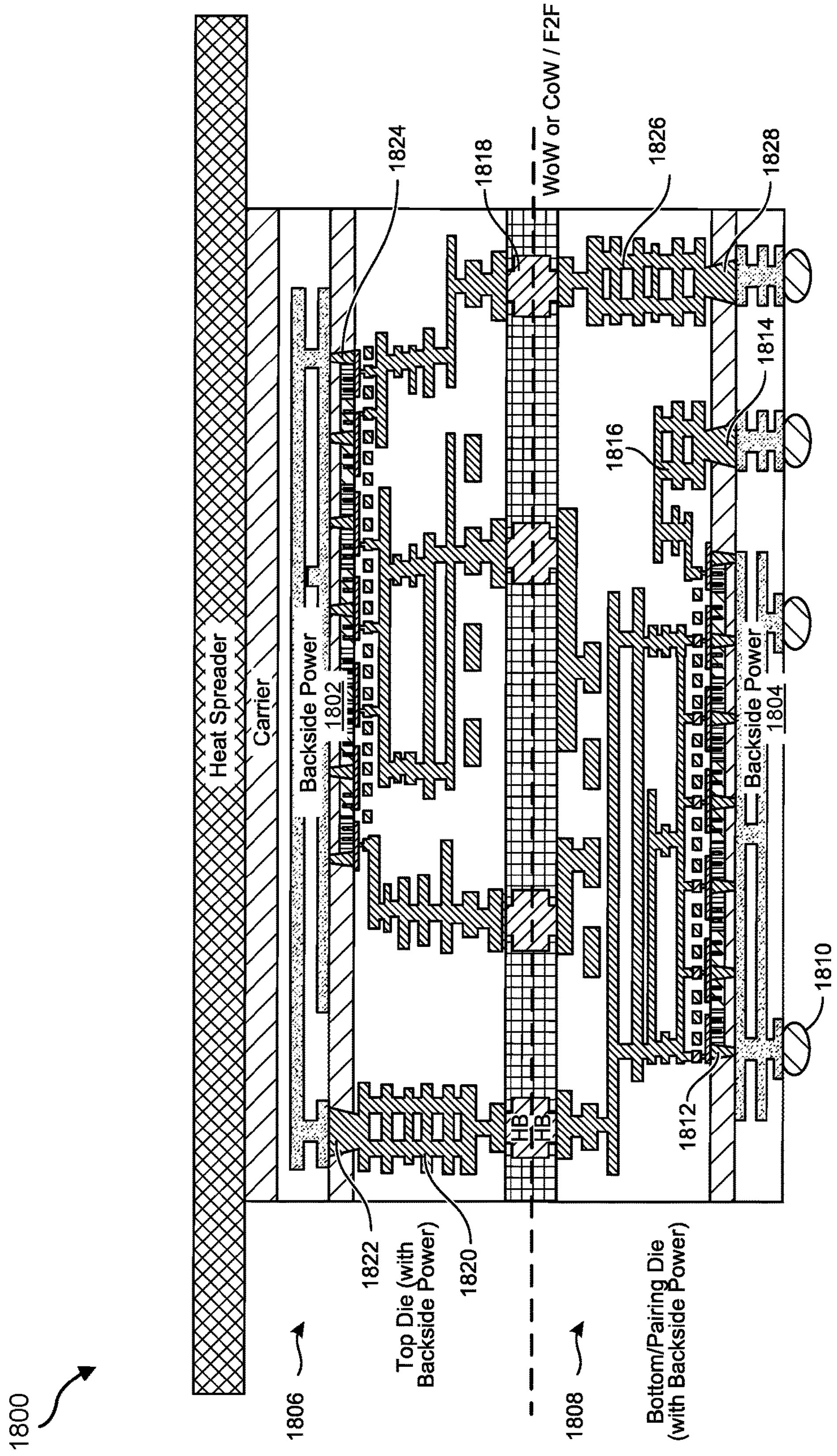
FIG. 18 is a block diagram illustrating an example semiconductor device that includes two die stacking with backside power delivery networks for both top and bottom die.

Referring to FIG. 18, an example semiconductor device 1800 can include two die stacking with a backside power delivery networks 1802 and 1804 for both top and bottom die 1806 and 1808, respectively. Power delivery network 1804 can receive power from connection elements 1810 and supply power to the bottom die 1808 using one or more backside vias 1812 and/or one or more nano through silicon vias 1814 and a power plane 1816. Frontside metal layers can also direct power through one or more hybrid bonds 1818 to a power curtain 1820 of top die 1806. A nano through silicon via 1822 can feed this power to backside power delivery network 1802 and one or more backside vias 1824 to circuit elements of the top die 1806. Semiconductor device 1800 can also have a signal feed through 1826 by one or more nano through silicon vias 1828.

Figure 19:
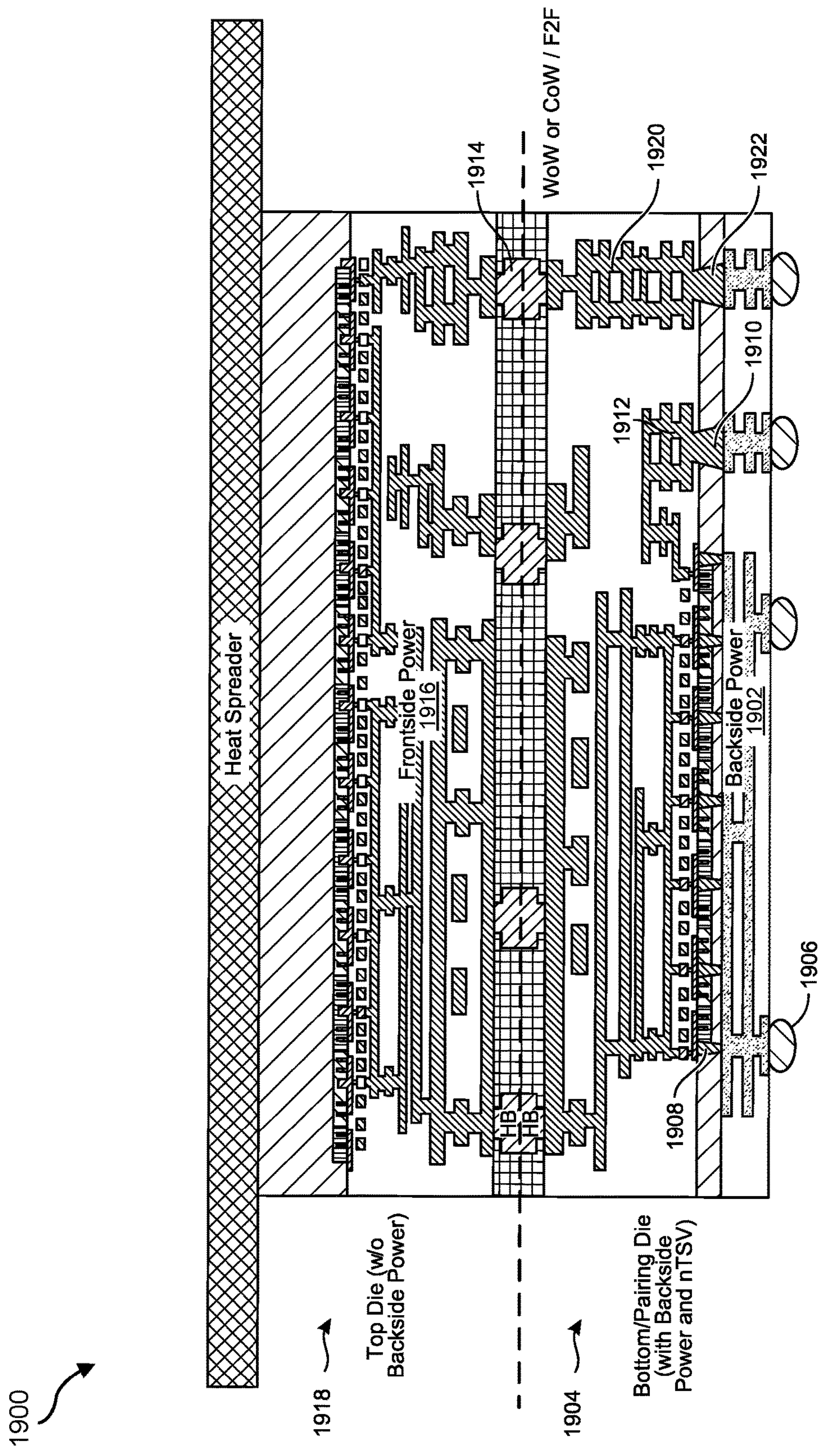
FIG. 19 is a block diagram illustrating an example semiconductor device that includes two die stacking with a backside power delivery network for a bottom die.

Referring to FIG. 19, an example semiconductor device 1900 can include two die stacking with backside power delivery network 1902 for a bottom die 1904. Backside power delivery network 1902 can receive power from connection elements 1906 and supply power to the bottom die 1904 using one or more backside vias 1908 and/or one or more nano through silicon vias 1910 and a power plane 1912. Frontside metal layers can also direct power through one or more hybrid bonds 1914 to a frontside power delivery network 1916 of top die 1918. Frontside power delivery network 1916 can feed power to circuit elements of the top die 1918. Semiconductor device 1900 can also have a signal feed through 1920 by one or more nano through silicon vias 1922.

Figure 20:
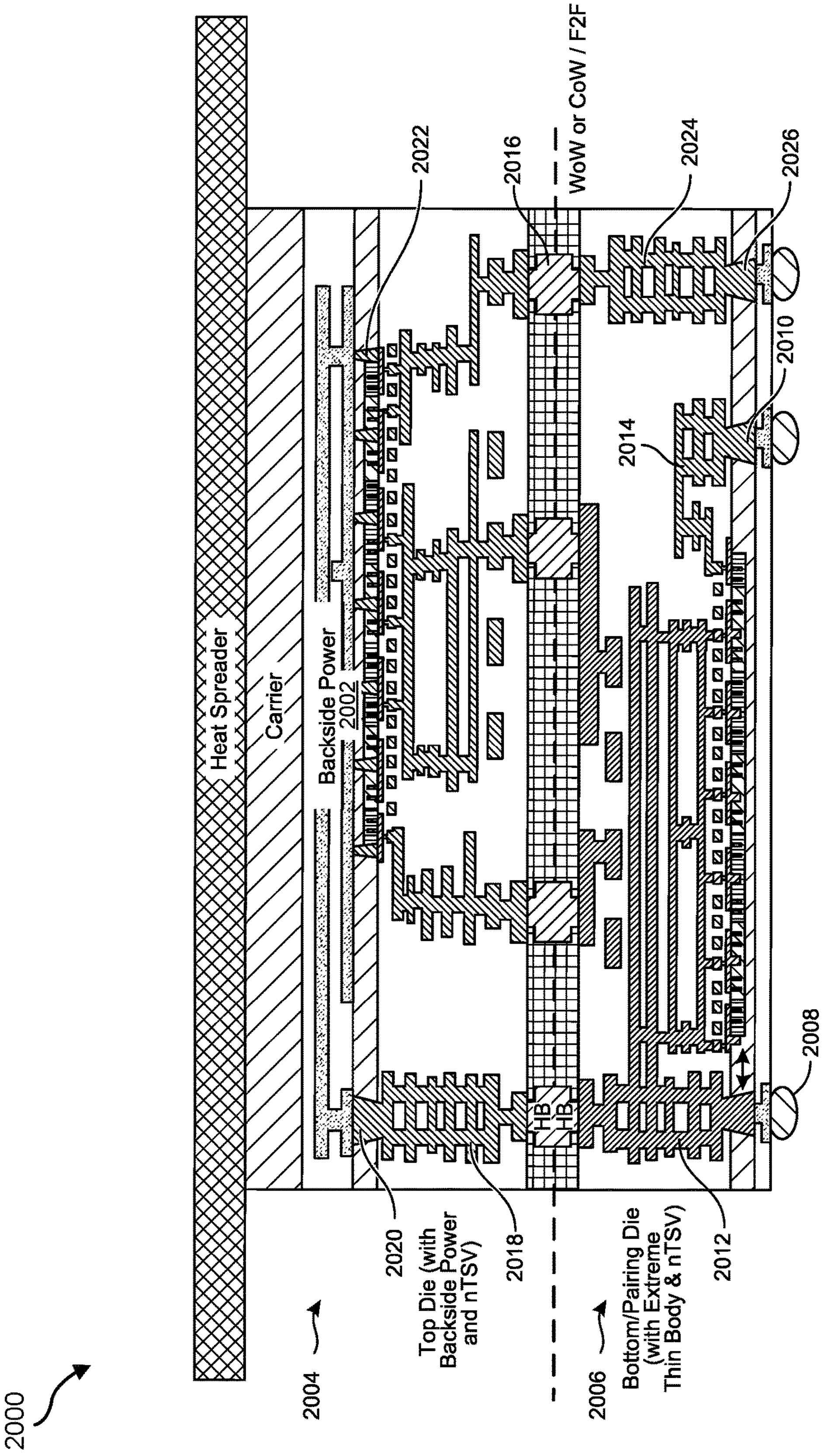
FIG. 20 is a block diagram illustrating an example semiconductor device that includes two die stacking with a backside power delivery network for a top die and backside power delivery for a bottom die having an extremely thin body and direct bonding to a package.

Referring to FIG. 20, an example semiconductor device 2000 can include two die stacking with a backside power delivery network 2002 for a top die 2004 and backside power delivery for a bottom die 2006 having an extremely thin body and direct bonding to a package. Bottom die 2006 can receive power from connection elements 2008 (e.g., direct bonding) and supply power to the bottom die 2006 using one or more nano through silicon vias 2010 and one or more power curtains 2012 and/or a power plane 2014. Frontside metal layers can also direct power through one or more hybrid bonds 2016 to a power curtain 2018 of top die 2004, which can supply power to backside power delivery network 2002 using one or more nano through silicon vias 2020. Backside power delivery network 2002 can feed power to circuit elements of the top die 2004 using backside vias 2022. Semiconductor device 2000 can also have a signal feed through 2024 by one or more nano through silicon vias 2026.

Figure 21:
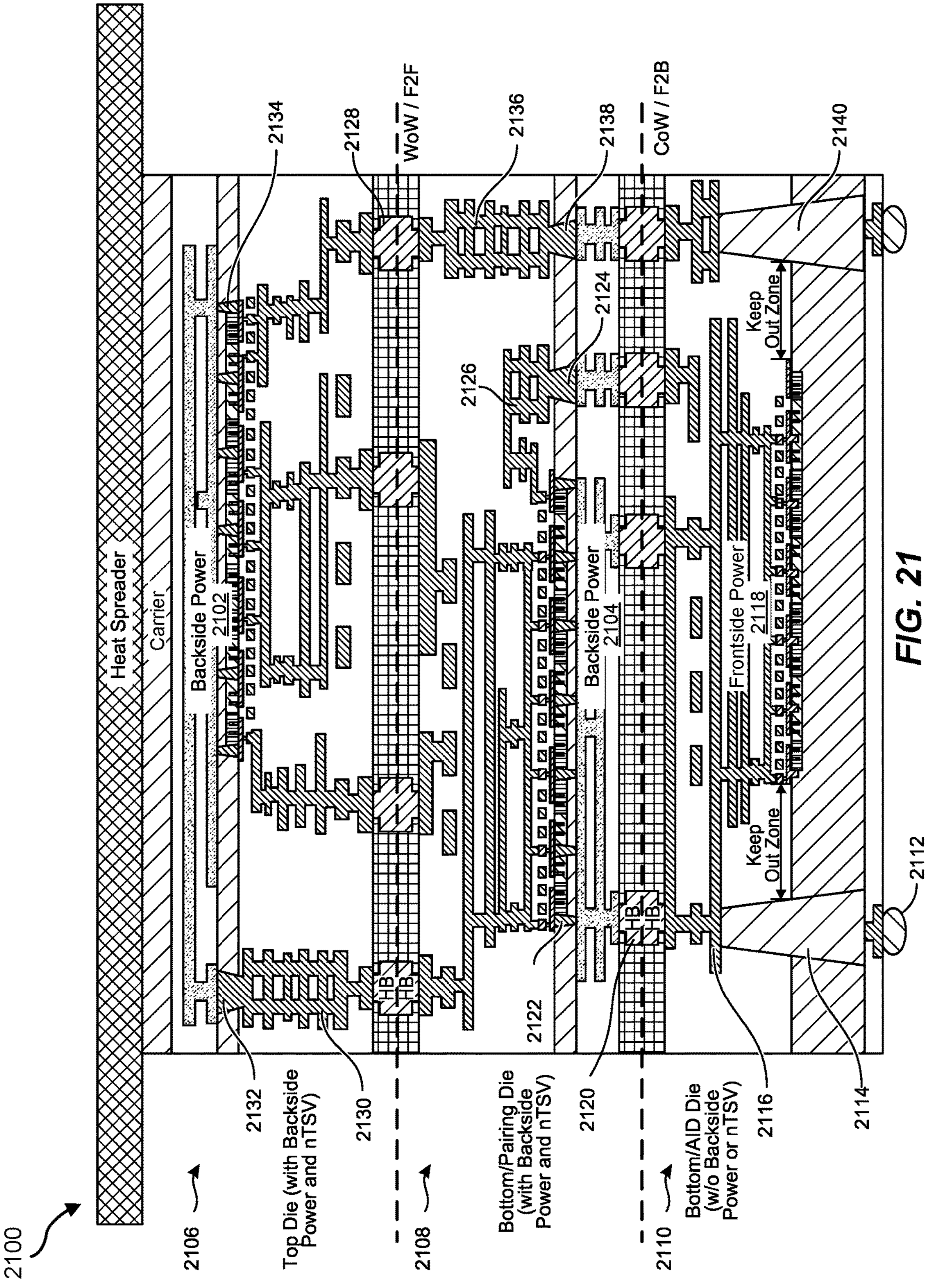
FIG. 21 is a block diagram illustrating an example semiconductor device that includes three die stacking with backside power delivery networks for both top and middle die.

Referring to FIG. 21, an example semiconductor device 2100 includes three die stacking with backside power delivery networks 2102 and 2104 for both a top die 2106 and a middle die 2108, respectively. A bottom die 2110 can correspond to an active interposer die. Connection elements 2112 of bottom die 2110 can receive power from a package substrate and convey the power by power curtains 2114 to a metal landing layer 2116 of a frontside power delivery network 2118 of the bottom die 2110. Frontside power delivery network 2118 can provide power to bottom die circuitry and also provide power to backside power delivery network 2104 using hybrid bonds 2120. Backside power delivery network 2104 can supply power to the middle die 2108 using one or more backside vias 2122 and/or one or more nano through silicon vias 2124 and a power plane 2126. Frontside metal layers can also direct power through one or more hybrid bonds 2128, power curtains 2130, and nano through silicon vias 2132 to backside power delivery network 2102 of top die 2106. Backside power delivery network 2102 can feed power to circuit elements of the top die 2106 by backside vias 2134. Semiconductor device 2100 can also have a signal feed through 2136 by one or more nano through silicon vias 2138 and 2140 and hybrid bonds 2120.

Figure 22:
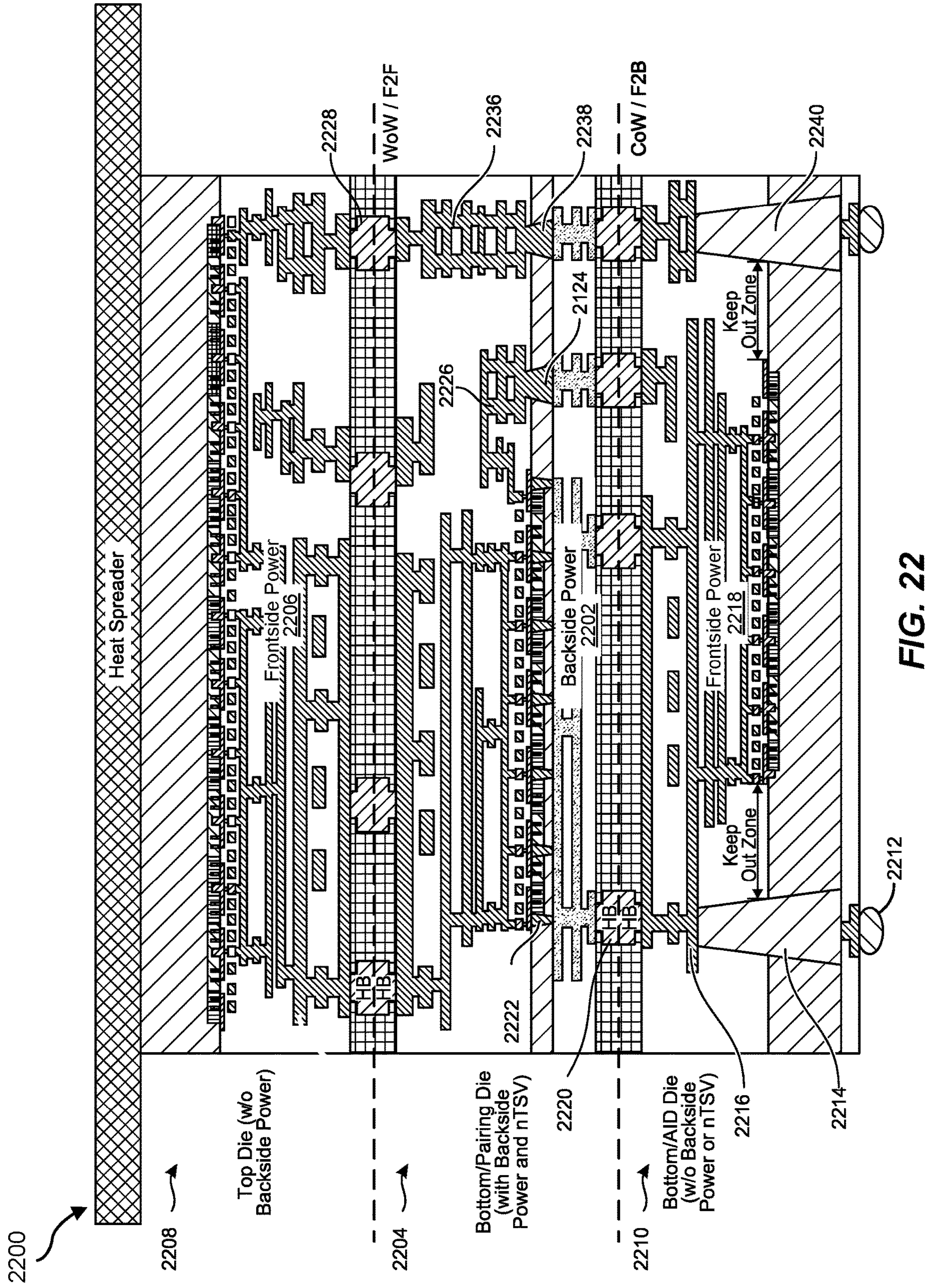
FIG. 22 is a block diagram illustrating an example semiconductor device that includes three die stacking with a backside power delivery network for a middle die.

Referring to FIG. 22, an example semiconductor device 2200 can include three die stacking with a backside power delivery network 2202 for a middle die 2204 and a frontside power delivery network 2206 for a top die 2208. A bottom die 2210 can correspond to an active interposer die. Connection elements 2212 of bottom die 2210 can receive power from a package substrate and convey the power by power curtains 2214 to a metal landing layer 2216 of a frontside power delivery network 2218 of the bottom die 2210. Frontside power delivery network 2218 can provide power to bottom die circuitry and also provide power to backside power delivery network 2202 using hybrid bonds 2220. Backside power delivery network 2202 can supply power to the middle die 2204 using one or more backside vias 2222 and/or one or more nano through silicon vias 2224 and a power plane 2226. Frontside metal layers can also direct power through one or more hybrid bonds 2228 to frontside power delivery network 2206 of top die 2208. Frontside power delivery network 2206 can feed power to circuit elements of the top die 2108. Semiconductor device 2100 can also have a signal feed through 2236 by one or more nano through silicon vias 2238 and 2240 and hybrid bonds 2220.

Figure 23:
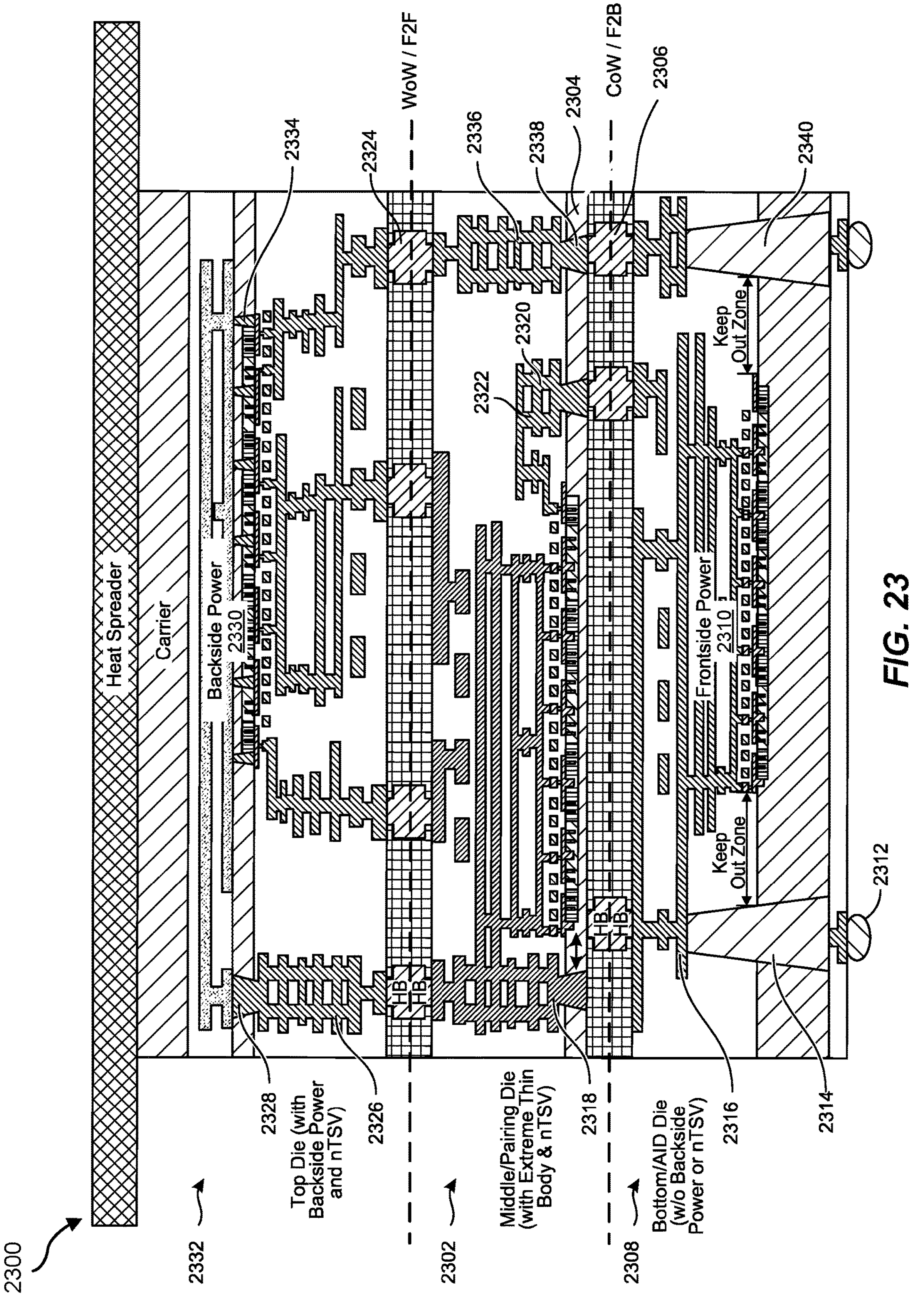
FIG. 23 is a block diagram illustrating an example semiconductor device that includes three die stacking with backside power delivery for a middle die having an extremely thin body and direct bonding to a bottom die.

Referring to FIG. 23, an example semiconductor device 2300 can include three die stacking with backside power delivery for a middle die 2302 having an extremely thin body 2304 and direct bonding 2306 and/or hybrid bonding to a bottom die 2308 having a frontside power delivery network 2310. Bottom die 2308 can correspond to an active interposer die. Connection elements 2312 of bottom die 2308 can receive power from a package substrate and convey the power by power curtains 2314 to a metal landing layer 2316 of frontside power delivery network 2310 of the bottom die 2308. Frontside power delivery network 2310 can provide power to bottom die circuitry and also provide power to extremely thin body 2304 of middle die 2302 using direct bonding 2306 and/or hybrid bonding. The extremely thin body 2304 can supply power to the middle die 2302 using one or more one or more nano through silicon vias 2318 and 2320 and a power plane 2322. Frontside metal layers can also direct power through one or more hybrid bonds 2324, power curtains 2326, and nano through silicon vias 2328 to backside power delivery network 2330 of top die 2332. Backside power delivery network 2330 can feed power to circuit elements of the top die 2332 by backside vias 2334. Semiconductor device 2300 can also have a signal feed through 2336 by one or more nano through silicon vias 2338 and 2340 and direct bonding 2306 and/or hybrid bonding.

Figure 24:
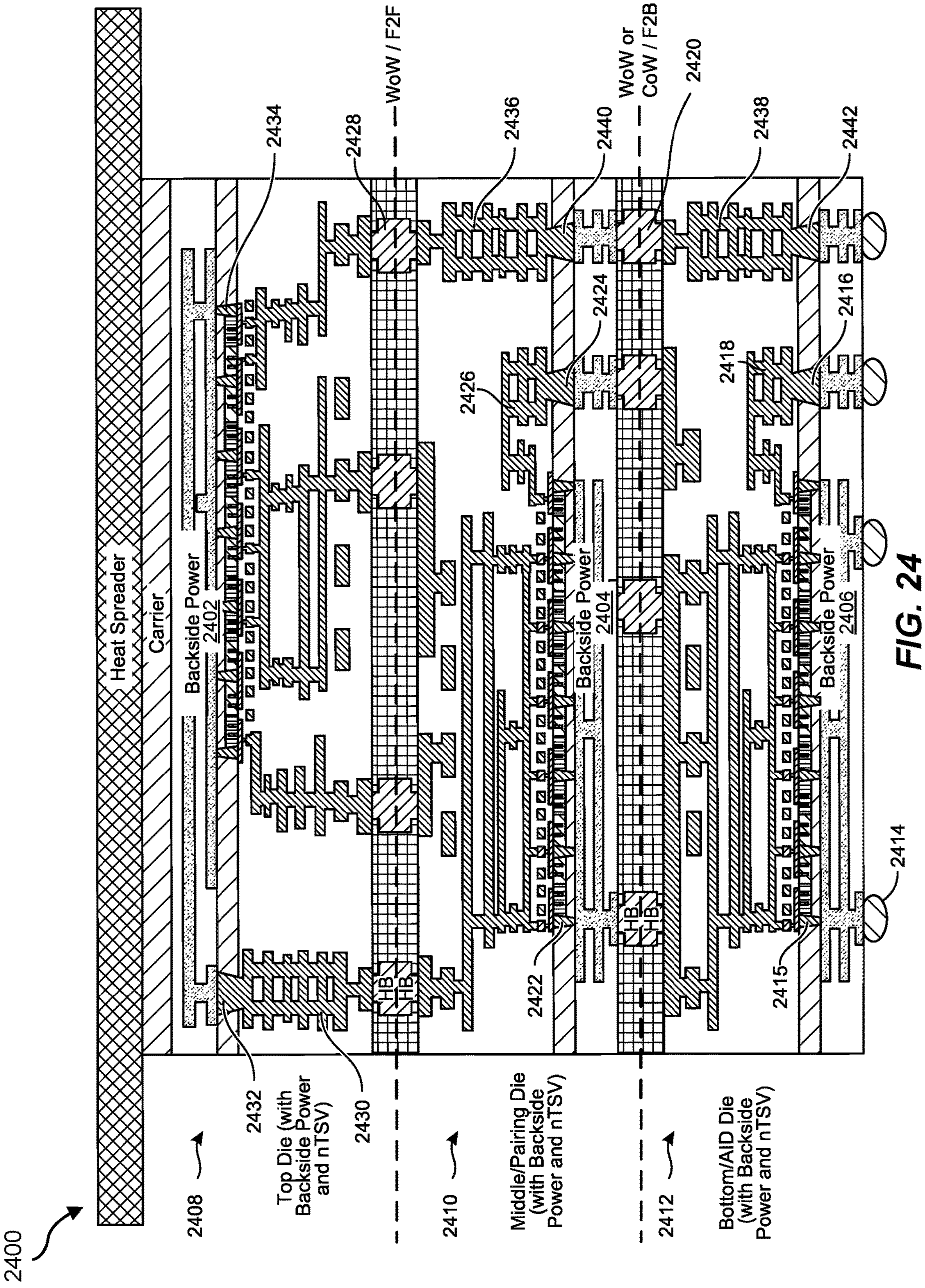
FIG. 24 is a block diagram illustrating an example semiconductor device that includes three die stacking with backside power delivery networks for top, middle, and bottom die.

Referring to FIG. 24, an example semiconductor device can include three die stacking with backside power delivery networks 2402, 2404, and 2406 for a top die 2408, a middle die 2410, and a bottom die 2412. Bottom die 2412 can correspond to an active interposer die. Connection elements 2414 of bottom die 2412 can receive power from a package substrate and convey the power to backside power delivery network 2406. Backside power delivery network 2406 can supply power to the bottom die 2412 using one or more backside vias 2415 and/or one or more nano through silicon vias 2416 and a power plane 2418. Frontside metal layers can also direct power through one or more hybrid bonds 2420 to backside power delivery network 2404. Backside power delivery network 2404 can supply power to the middle die 2410 using one or more backside vias 2422 and/or one or more nano through silicon vias 2424 and a power plane 2426. Frontside metal layers can also direct power through one or more hybrid bonds 2428, power curtains 2430, and nano through silicon vias 2432 to backside power delivery network 2402 of top die 2408. Backside power delivery network 2402 can feed power to circuit elements of the top die 2408 by backside vias 2434. Semiconductor device 2400 can also have one or more signal feed throughs 2436 and 2438 by one or more nano through silicon vias 2440 and 2442 and hybrid bonds 2420.

Figure 25:
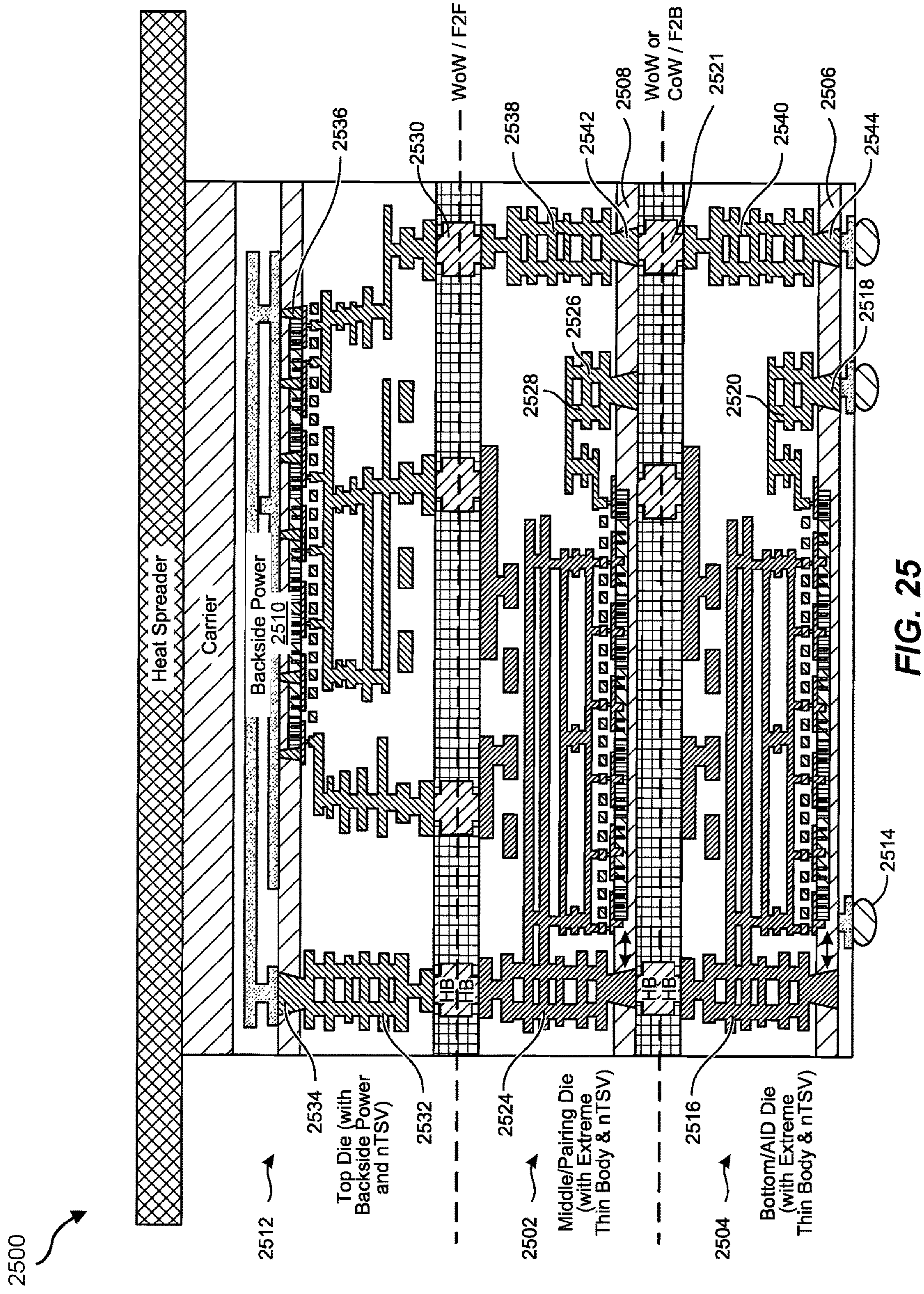
FIG. 25 is a block diagram illustrating an example semiconductor device that includes three die stacking with backside power delivery for both middle and bottom die having extremely thin body and a backside power delivery network for a top die.

Referring to FIG. 25, an example semiconductor device 2500 can include three die stacking with backside power delivery for both a middle die 2502 and bottom die 2504 having extremely thin body 2506 and 2508 and a backside power delivery network 2510 for a top die 2512. Bottom die 2504 can correspond to an active interposer die. Connection elements 2514 of bottom die 2504 can receive power from a package substrate and convey the power to extremely thin body 2506 of bottom die 2504. The extremely thin body 2506 can supply power to the bottom die 2504 using one or more one or more nano through silicon vias 2516 and 2518 and a power plane 2520. Frontside metal layers can also direct power through direct bonding 2521 and/or hybrid bonds to extremely thin body 2508 of the middle die 2502. The extremely thin body 2508 can supply power to the middle die 2502 using one or more nano through silicon vias 2524 and 2526 and a power plane 2528. Frontside metal layers can also direct power through one or more hybrid bonds 2530, power curtains 2532, and nano through silicon vias 2534 to backside power delivery network 2510 of top die 2512. Backside power delivery network 2510 can feed power to circuit elements of the top die 2512 by backside vias 2536. Semiconductor device 2500 can also have signal feed throughs 2538 and 2540 by one or more nano through silicon vias 2542 and 2544 and direct bonding 2521 and/or hybrid bonding.

As detailed above, the integrated circuits and semiconductor devices described herein can implement die pair device partitioning. The disclosed approach to implementing a process node entails pairing of two sets of devices manufactured as separate process nodes but connected with 3D hybrid bonding (e.g., face to face). Neither of these paired nodes contain the full set of optimized devices required for a new process node, but they do so as a pair. This approach enables an "advanced" version of the process pair to include (e.g., principally or exclusively) logic transistors that are manufactured in isolation and optimized purely to improve the performance and power efficiency of logic without the compromises needed to support SRAM and analog devices. The SRAM and analog devices, plus less optimized logic devices, can be implemented (e.g., principally or exclusively) in a "pair" technology node that is also manufactured in isolation and then 3D bonded to the advanced node. The combination of the advanced and pair node in a 3D hybrid bonded configuration can deliver a much higher performing, more efficient (e.g., for logic which is the most important contributor to technology node gains), and fully functional (e.g., SRAM and analog) technology node for a SoC design.

Benefits obtained from the above results can include avoiding the manufacturing compromises required to balance a process window delivering the full suite of analog, SRAM, and logic devices in an advanced technology node. The advanced node can focus (e.g., exclusively) on optimizing the logic devices. These logic devices are the most important contributors to performance and performance/Watt. Additionally, the combination of the node pairs can provide a denser, higher performance, and more power efficient technology than a one-size-fits-all technology node with all devices in a single FEOL.

The process parameters and sequence of the steps described and/or illustrated herein are given by way of example only and can be varied as desired. For example, while the steps illustrated and/or described herein are shown or discussed in a particular order, these steps do not necessarily need to be performed in the order illustrated or discussed. The various exemplary methods described and/or illustrated herein can also omit one or more of the steps described or illustrated herein or include additional steps in addition to those disclosed.

The preceding description has been provided to enable others skilled in the art to best utilize various aspects of the exemplary implementations disclosed herein. This exemplary description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An integrated circuit comprising:

a first circuit die having a first metal stack;

a second circuit die having a second metal stack that is connected to the first metal stack of the first circuit die; and a backside power delivery network embedded in at least one of the first circuit die or the second circuit die, wherein the backside power delivery network comprises a lateral power routing layer embedded in a backside of the at least one of the first circuit die or the second circuit die.

2. The integrated circuit of claim 1, wherein the backside power delivery network provides power directly to a transistor layer of the at least one of the first circuit die or the second circuit die by at least one of backside vias or nano through silicon vias.

3. The integrated circuit of claim 1, wherein the backside power delivery network is located in a passivation layer of the first circuit die.

4. The integrated circuit of claim 3, further comprising:

an additional backside power delivery network in an additional passivation layer of the second circuit die.

5. The integrated circuit of claim 4, wherein the additional backside power delivery network provides power directly to a transistor layer of the second circuit die.

6. The integrated circuit of claim 5, wherein the additional backside power delivery network provides power directly to the transistor layer of the second circuit die by at least one of backside vias or nano through silicon vias.

7. The integrated circuit of claim 3, wherein a transistor layer of the second circuit die is configured to receive power directly from an additional die by direct bonding of a silicon body of the second circuit die to the additional die.

8. A semiconductor device comprising:

an integrated circuit that includes:

a first circuit die having a first metal stack, wherein the first circuit die corresponds to a primary thermal source of the integrated circuit; and a second circuit die having a second metal stack that is connected to the first metal stack of the first circuit die;

an additional die connected to the second circuit die; and a backside power delivery network in at least one of the first circuit die, or the second circuit die, wherein the backside power delivery network comprises a lateral power routing layer embedded in a backside of the at least one of the first circuit die or the second circuit die.

9. The semiconductor device of claim 8, wherein the backside power delivery network is located in a passivation layer of the first circuit die.

10. The semiconductor device of claim 9, further comprising:

an additional backside power delivery network in an additional passivation layer of the second circuit die.

11. The semiconductor device of claim 9, further comprising:

an additional backside power delivery network in an additional passivation layer of the additional die.

12. The semiconductor device of claim 9, wherein a transistor layer of the second circuit die is configured to receive power directly from the additional die by direct bonding of a silicon body of the second circuit die to the additional die.

13. The semiconductor device of claim 9, wherein a transistor layer of the additional die is configured to receive power directly from a package of the semiconductor device by direct bonding of a silicon body of the additional die to the package of the semiconductor device.

14. A method, comprising:

providing a first circuit die having a first metal stack; and connecting a second metal stack of a second circuit die to the first metal stack of the first circuit die, wherein a backside power delivery network is located in at least one of the first circuit die or the second circuit die, wherein the backside power delivery network comprises a lateral power routing layer embedded in a backside of the at least one of the first circuit die or the second circuit die.

15. The method of claim 14, wherein the backside power delivery network is located in a passivation layer of the first circuit die.

16. The method of claim 15, further comprising:

an additional backside power delivery network in an additional passivation layer of the second circuit die.

17. The method of claim 15, further comprising:

connecting an additional die to the second circuit die.

18. The method of claim 17, wherein an additional backside power delivery network is located in an additional passivation layer of the additional die.

19. The method of claim 17, wherein a transistor layer of the second circuit die is configured to receive power directly from the additional die by direct bonding of a silicon body of the second circuit die to the additional die.

20. The method of claim 17, wherein a transistor layer of an active interposer die is configured to receive power directly from a package of a semiconductor device by direct bonding of a silicon body of the additional die to the package of the semiconductor device.

* * * * *